United States Patent [19]

Aritome

[11] Patent Number: 5,568,421
[45] Date of Patent: Oct. 22, 1996

[54] SEMICONDUCTOR MEMORY DEVICE ON WHICH SELECTIVE TRANSISTORS ARE CONNECTED TO A PLURALITY OF RESPECTIVE MEMORY CELL UNITS

[75] Inventor: Seiichi Aritome, Kawasaki, Japan

[73] Assignee: Kabushiki Kaisha Toshiba, Kawasaki, Japan

[21] Appl. No.: 402,822

[22] Filed: Mar. 10, 1995

[30]     Foreign Application Priority Data

Mar. 14, 1994  [JP]  Japan ................................. 6-042363

[51] Int. Cl.$^6$ .......................... G11C 16/02; H01L 29/788
[52] U.S. Cl. ................................ 365/185.17; 365/185.11; 257/316
[58] Field of Search ...................... 365/185.17, 185.18, 365/185.11; 257/316, 326

[56]            References Cited

U.S. PATENT DOCUMENTS

| | | |
|---|---|---|
| 4,959,812 | 9/1990 | Momodomi et al. . |
| 5,179,427 | 1/1993 | Nakayama ..................... 365/185.17 |
| 5,291,440 | 3/1994 | Koyama ........................ 365/185.18 |
| 5,293,337 | 3/1994 | Aritome et al. . |
| 5,321,286 | 6/1994 | Koyama ........................ 365/185.17 |
| 5,338,956 | 8/1994 | Nakamura .................... 365/185.17 |

OTHER PUBLICATIONS

IEDM 92, pp. 599–602, 1992, H. Onoda, et al., "A Novel Cell Structure Suitable For A 3 Volt Operation, Sector Erase Flash Memory".

IEDM 92, pp. 991–993, 1992, Hitoshi Kume, et al., "A 1.28um$^2$ Contactless Memory Cell Technology For A 3V–Only 64MBIT EEPROM".

IEDM 93, pp. 19–22, 1993, Yosiaki S. Hisamune, et al., "A High Capacitive-Coupling Ratio (HICR) Cell For 3 V–Only 64 MBIT And Future Flash Memories".

*Primary Examiner*—David C. Nelms
*Assistant Examiner*—Son Mai
*Attorney, Agent, or Firm*—Oblon, Spivak, McClelland, Maier & Neustadt, P.C.

[57]             ABSTRACT

A semiconductor memory device of this invention includes a semiconductor substrate, a plurality of memory cell units each having a plurality of memory cells each of which has a charge storage layer and a control gate stacked on the semiconductor substrate and in which the write and erase operations are effected by transferring charges between the charge storage layer and the semiconductor substrate as one unit, a plurality of data lines for transferring data with respect to the plurality of memory cell units, and a plurality of selective transistors arranged between the plurality of memory cell units and the plurality of data lines and each having a first end connected to a corresponding one of the plurality of memory cell units and a second end connected to a corresponding one of the plurality of data lines. The plurality of selective transistors are formed of thin film transistors having thin film semiconductor layers formed on the plurality of memory cell units as channel sections thereof.

18 Claims, 19 Drawing Sheets

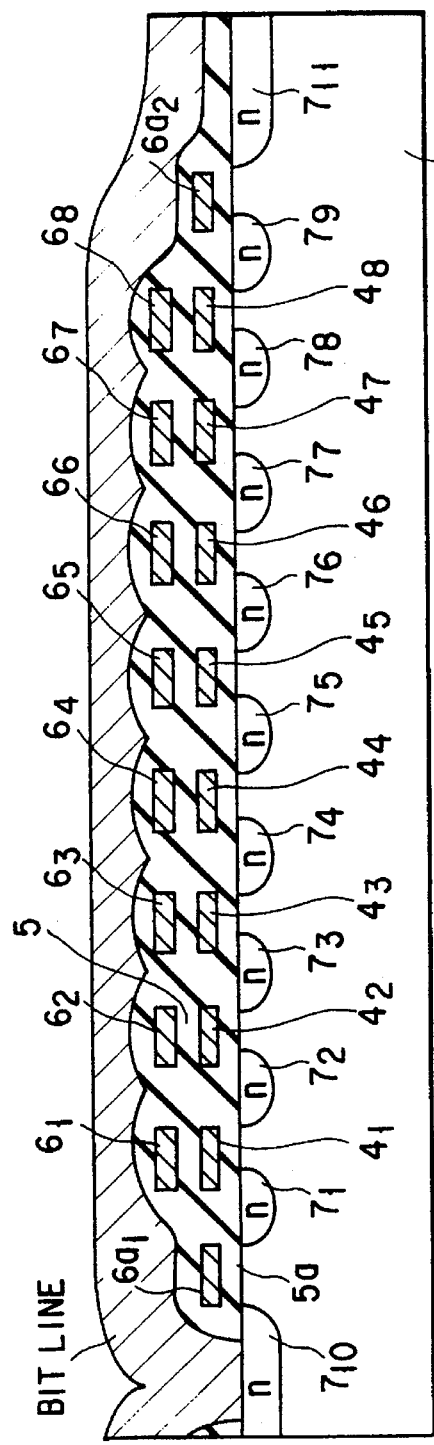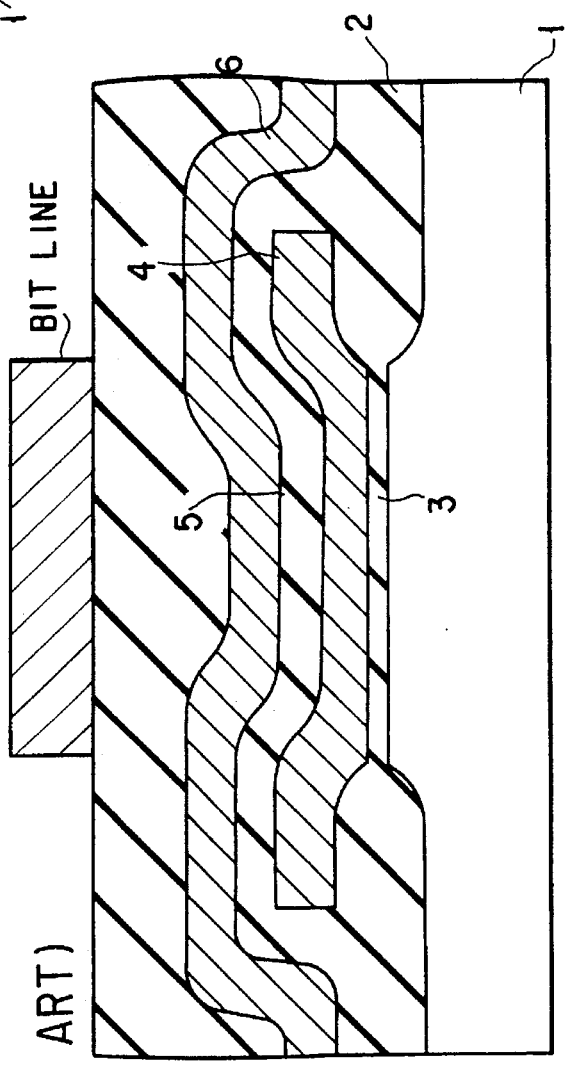
FIG. 2A (PRIOR ART)
FIG. 2B (PRIOR ART)

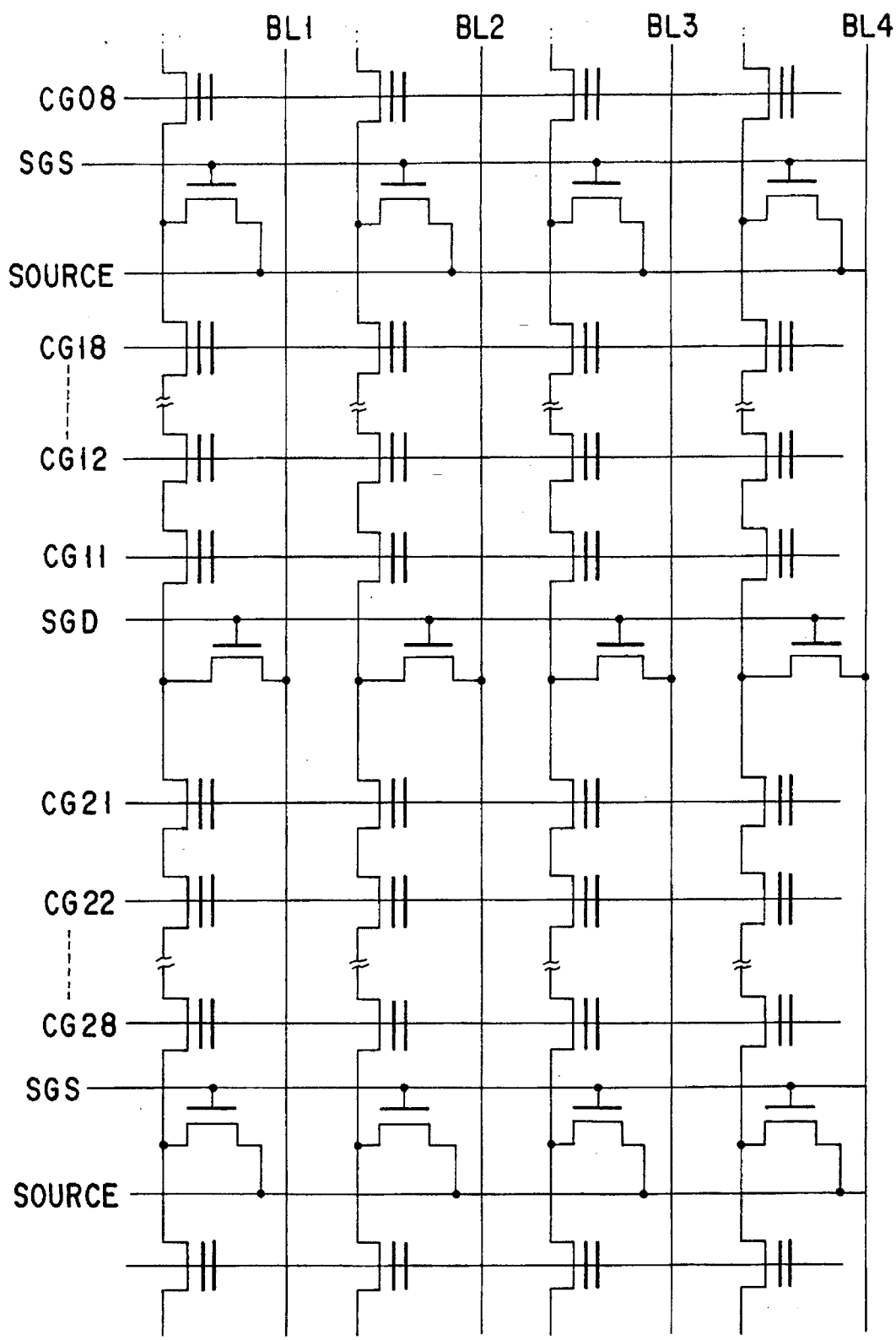
F I G. 5

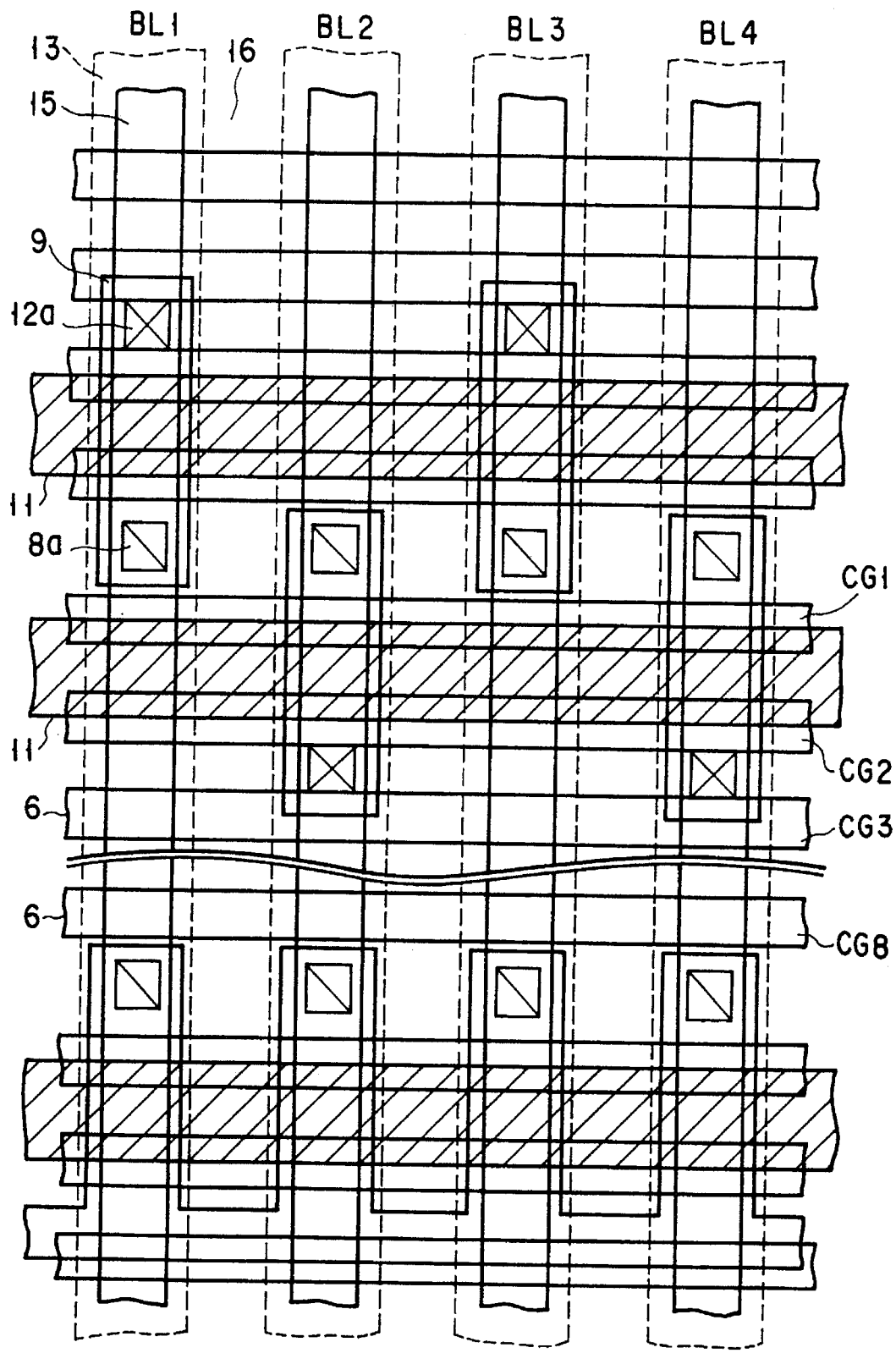
F I G. 8

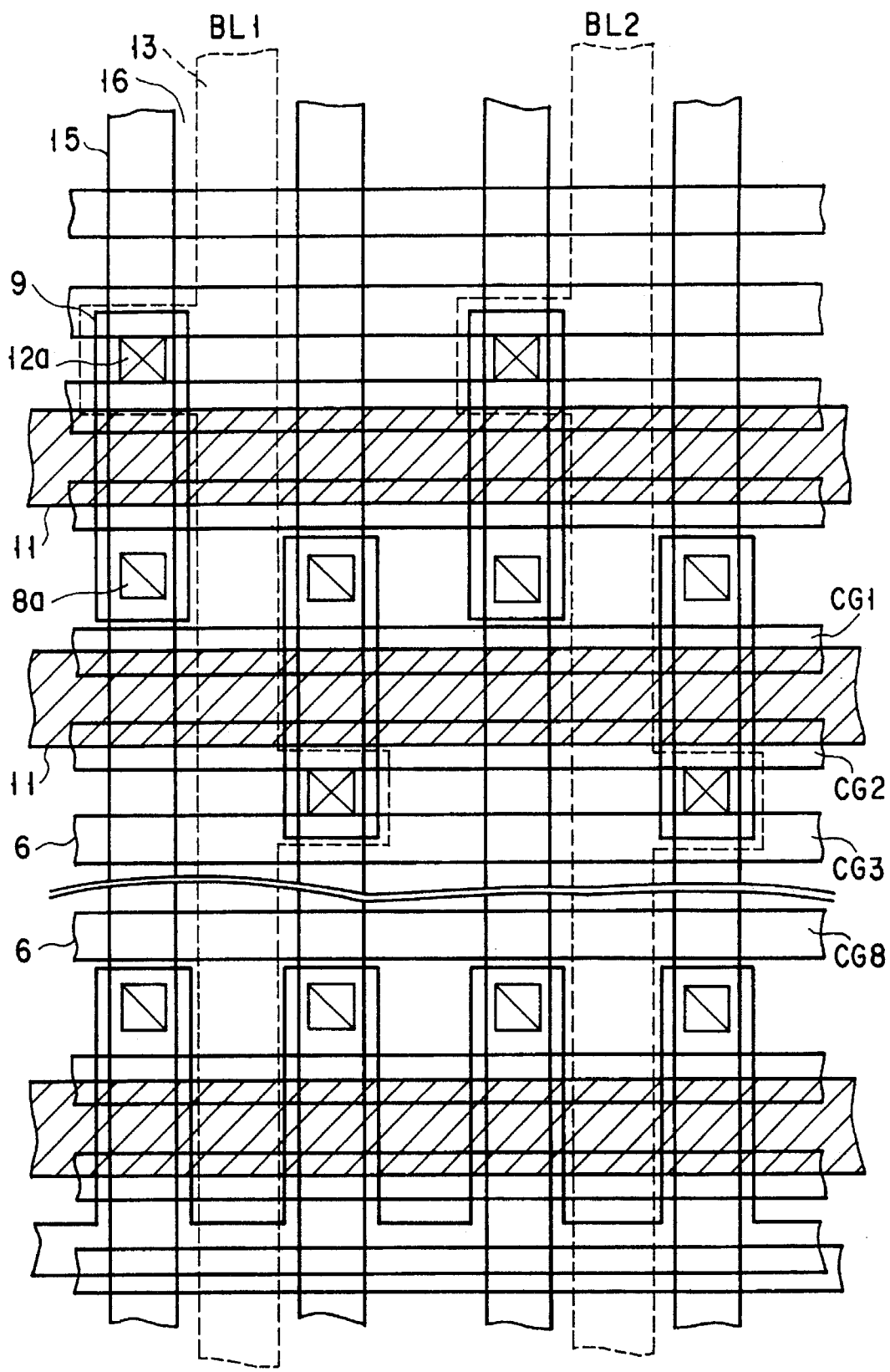
F I G. 10

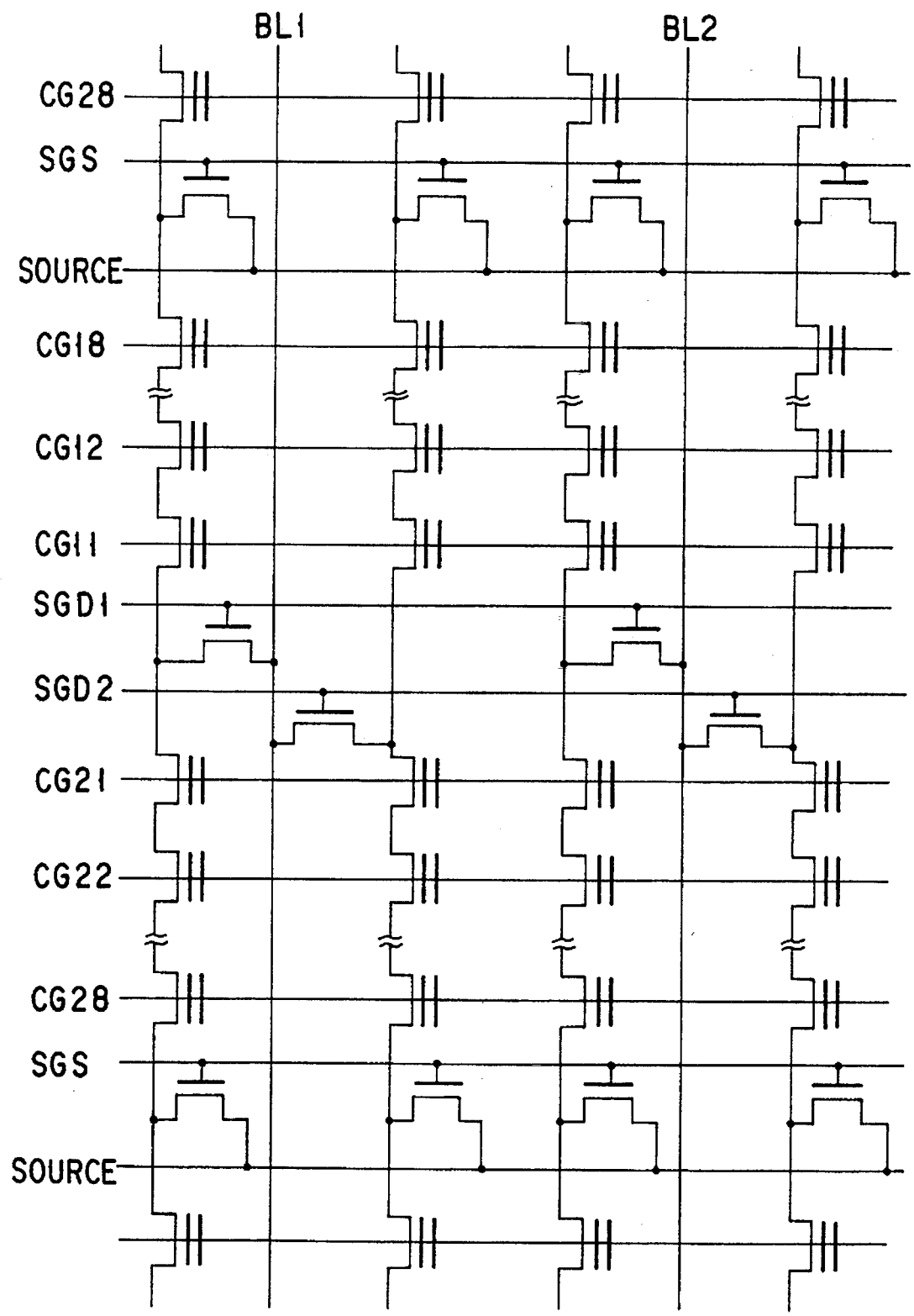
F I G. 11

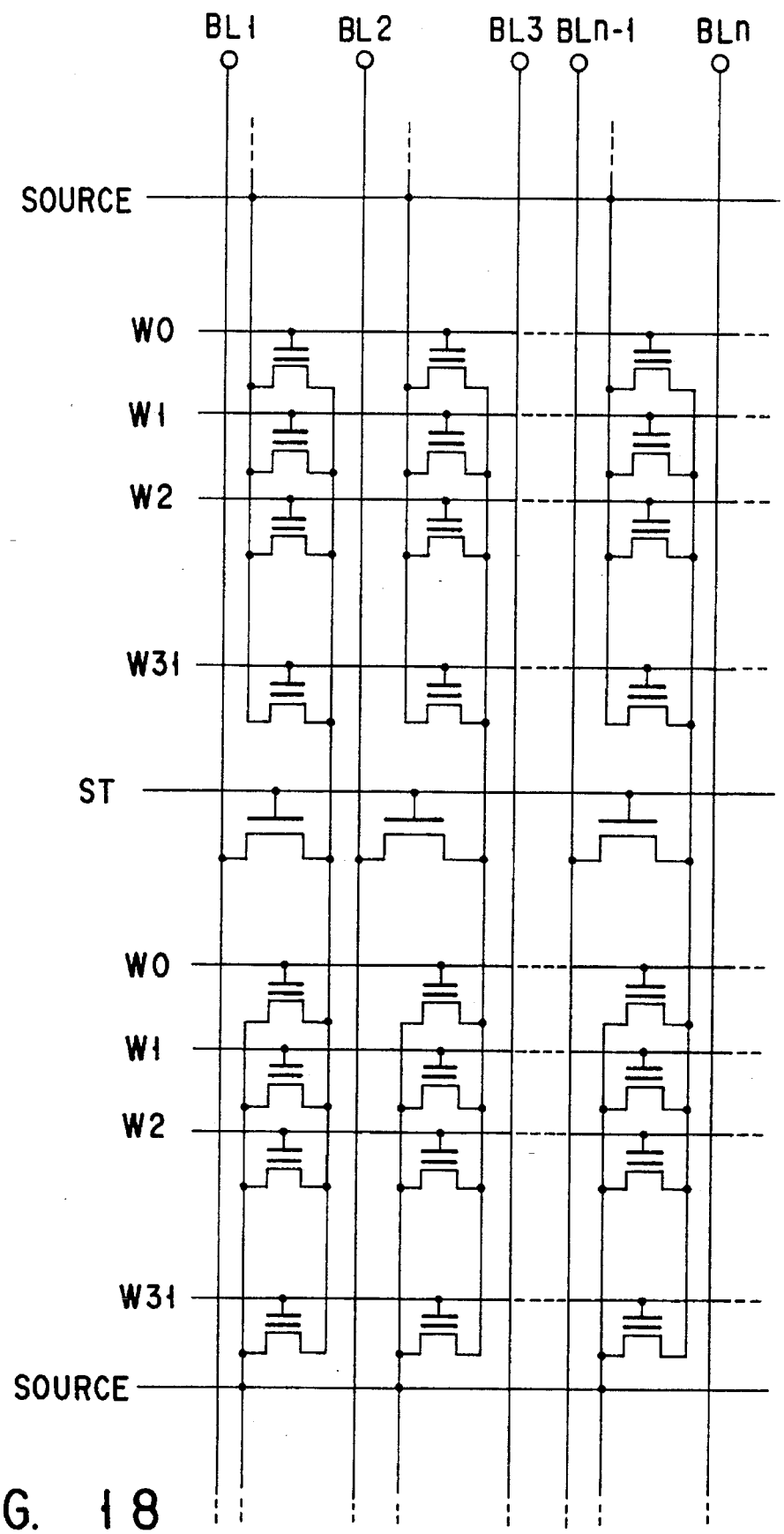
F I G. 18

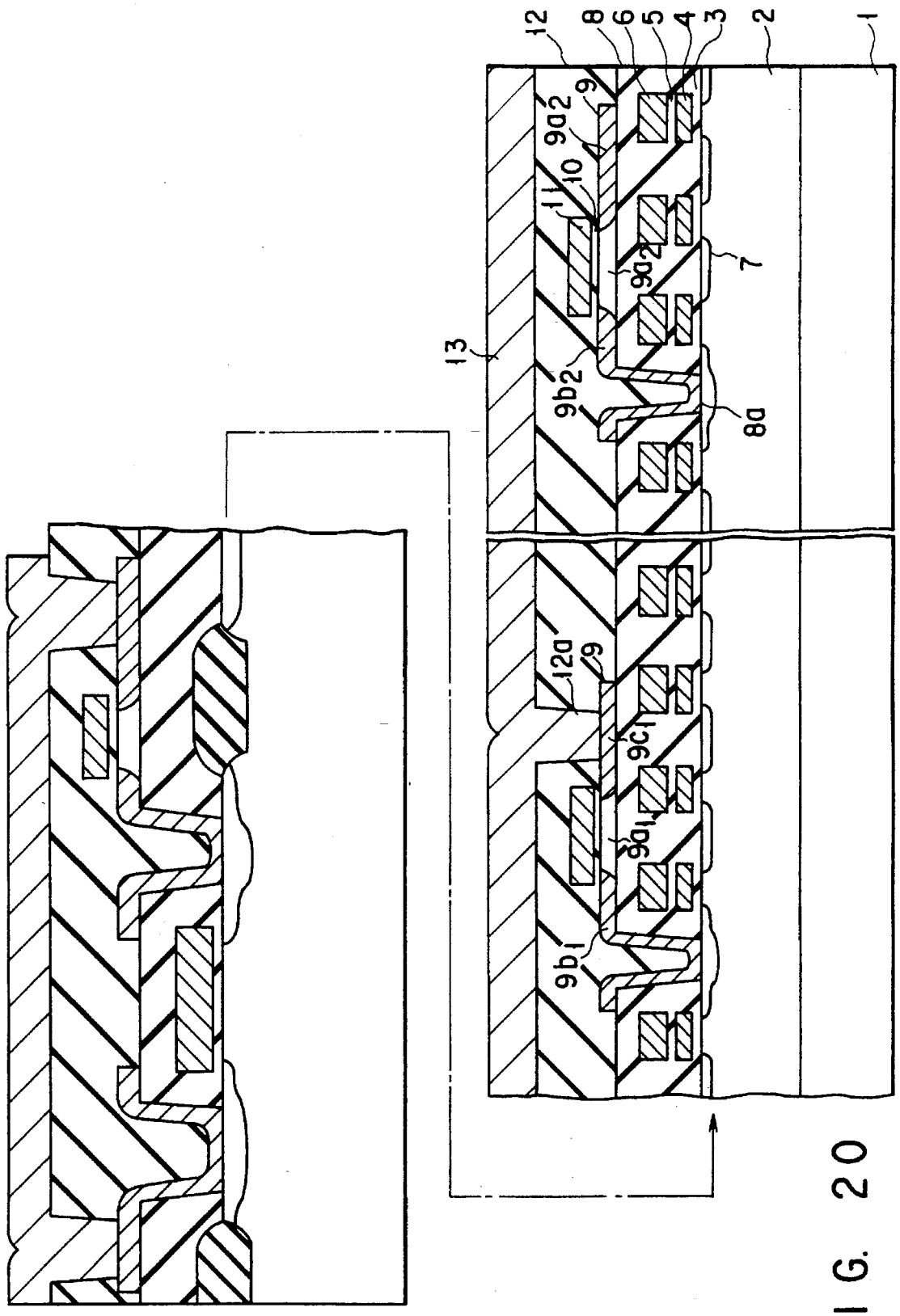

SEMICONDUCTOR MEMORY DEVICE ON WHICH SELECTIVE TRANSISTORS ARE CONNECTED TO A PLURALITY OF RESPECTIVE MEMORY CELL UNITS

BACKGROUND OF THE INVENTION

1. Field of the Invention

This invention relates to particularly a semiconductor memory device whose memory cell unit is constituted by connecting a plurality of memory cells each of which has MOS transistor structure.

2. Description of the Related Art

Recently, an EEPROM with structure designed to attain the high integration density by constituting a memory cell unit having a plurality of memory cells formed as one unit and connecting a data line to the memory cell unit to reduce the number of contacts with the data line is known as an electrically programmable non-volatile semiconductor device (EEPROM) which can be formed with high integration density. For example, an EEPROM having NAND cells each constituted by serially connecting a plurality of memory cells is known. FIG. 1 is a plan view showing one of the NAND cells of this type of EEPROM, and FIGS. 2A and 2B are cross sectional views taken along the lines 2A—2A and 2B—2B of FIG. 1.

A NAND cell having eight memory cells M1 to M8 and two selective transistors S1, S2 is arranged and formed in an area of a p-type silicon substrate 1 (or a wafer having a p-type well formed in an n-type silicon substrate) defined by an element separating insulative film 2. In order to form the memory cells constituting the NAND cell, floating gates 4 ($4_1$, $4_2$, - - -) of first-layer polysilicon film are formed over the substrate 1 with first gate insulative films 3 disposed therebetween and control gates 6 ($6_1$, $6_2$, - - -) of second-layer polysilicon film are formed over the floating gates with second gate insulative films 5 disposed therebetween.

The gate insulative films 5a of the selective transistors S1, S2 are formed at the same time as the second gate insulative films 5 and gate electrodes 6a1 and 6a2 thereof are formed at the same time as the control gates 6. The control gate 6 of each memory cell is continuously formed in the row direction to act as a word line. An n-type diffusion layer 7 acting as a source/drain is formed between the memory cells, the adjacent memory cells commonly use the source/drain, and a plurality of memory cells are serially connected to constitute the NAND cell.

The write and erase operations of the NAND-type cell EEPROM are effected by transferring charges by a tunneling current flowing between the substrate 1 and the floating gate 4. The NAND-type cell EEPROM has an advantage over the conventional NOR type EEPROM that the number of contacts can be significantly reduced and the high integration density can be attained.

However, if attempts are made to further increase the integration density of the EEPROM, the following problem which must be solved occurs.

The area of a portion other than the memory cells, particularly the area occupied by the selective transistors S1, S2 must be reduced. In the case of NAND cell, the selective transistors S1, S2 are necessary and indispensable to attain the selectivity with the adjacent NAND cell. Further, owing to the high resistance of the diffusion layer of the source line, a sufficiently large cell current cannot be obtained and high-speed access cannot be attained. Since the punch-through breakdown voltage of the selective gate is lowered because of miniaturization of the elements, the gate length of the selective gate cannot be reduced, thereby the area of the selective gate section cannot be reduced.

As described above, in the conventional non-volatile semiconductor memory device, the area occupied by the selective transistor portion cannot be reduced, making it more difficult to enhance the integration density. Further, the high-speed access cannot be attained and the problem that the punch-through breakdown voltage is lowered occurs.

SUMMARY OF THE INVENTION

An object of this invention is to provide a semiconductor memory device in which the area occupied by selective transistors is substantially eliminated and the integration density is enhanced to attain high-speed access and high reliability.

The gist of this invention is that selective transistors connected to memory cell units are connected to the drains or sources of a plurality of memory cell units. Further, the selective transistor is stacked and formed on the memory cell unit as a thin film transistor (which is hereinafter referred to as "TFT").

The above object can be attained by a semiconductor memory device comprising: a semiconductor substrate; a word line arranged in a predetermined direction; a plurality of memory cell units each having a plurality of memory cells each of which has a charge storage layer and a control gate stacked on the semiconductor substrate and in which the write and erase operations are effected by transferring charges between the charge storage layer and the semiconductor substrate as one unit; a plurality of data lines arranged in a direction crossing the word line and for transferring data with respect to the plurality of memory cell units; and a plurality of selective transistors arranged between the plurality of memory cell units and the plurality of data lines and each having a first end connected to a corresponding one of the plurality of memory cell units and a second end connected to a corresponding one of the plurality of data lines, and wherein the first end of each of the plurality of selective transistors are shared by adjacent memory cell units in a data line direction.

Further, the above object can be attained by a semiconductor memory device comprising: a semiconductor substrate; a plurality of memory cell units each having a plurality of memory cells each of which has a charge storage layer and a control gate stacked on the semiconductor substrate and in which the write and erase operations are effected by transferring charges between the charge storage layer and the semiconductor substrate as one unit; a plurality of selective transistors constructed by thin film transistors which have thin film semiconductor layers formed on the plurality of memory cell units as channel sections; and a plurality of data lines connected to the plurality of memory cell units via the plurality of selective transistors.

The preferable aspects of this invention are as follows:

(1) The memory cell is an EEPROM, mask ROM or SRAM.

(2) The memory cell unit is a NAND cell having a plurality of series-connected memory cells. Alternatively, the memory cell unit is of AND type, DINOR type or NOR type.

(3) The positions of contact portions for connecting the selective transistors arranged on the drain side of the memory cell unit to the data lines (bit lines) are deviated from each other in the adjacent bit lines.

(4) A plurality of selective transistors include first and second selective transistors which are adjacent in a word line direction, the adjacent memory cell units arranged in a word line direction are connected to the same data line via the first and second selective transistors, respectively, and a desired one of the memory cell units is operated by rendering one of the first and second selective transistors connected to the same data line conductive to selecting one of the adjacent memory cell units.

(5) Each of a plurality of memory cell units has a first end connected to a corresponding one of the plurality of data lines via a corresponding one of the plurality of selective transistors and a second end connected to a different one of the plurality of data lines via a different one of the plurality of selective transistors. More specifically, a plurality of memory cell units are serially connected, each connection node thereof is connected to the data line via the selective transistor, and each memory cell unit is driven with one of the data lines used as a bit line and the other data line used as a source line.

(6) The thin film transistor is formed in a peripheral circuit portion except the memory cell unit portion.

According to this invention, since the selective transistor is connected to the diffusion layers of a plurality of memory cell units or the selective transistor formed of TFT is formed above the memory cell unit, the occupied area of the selective transistor portion can be substantially eliminated, thereby increasing the integration density. Further, it becomes unnecessary to form two types of selective transistor portion and memory cell portion as the gate insulative film when the memory cell unit is formed and it is only necessary to form one type of memory cell portion, thus making it possible to reduce the number of steps. Since the selective transistor is formed above the memory cell unit, the degree of freedom for array connection is increased and, for example, an advantage that the source line is removed and an adjacent bit line can be substituted therefor can be attained and the high performance can be attained.

Therefore, according to this invention, a non-volatile semiconductor memory device in which the area occupied by the selective transistor can be substantially eliminated and the integration density can be further enhanced can be obtained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 2A and 2B are cross sectional views taken along the lines 2A—2A and 2B—2B of FIG. 1;

FIG. 5 is an equivalent circuit diagram of a cell array shown in FIGS. 3 and 4;

FIG. 8 is a plan view showing the schematic structure of a NAND-type cell EEPROM according to a second embodiment;

FIG. 10 is a plan view showing the schematic structure of a NAND-type cell EEPROM according to a third embodiment;

FIG. 11 is an equivalent circuit diagram of a cell array shown in FIG. 10;

FIG. 18 is an equivalent circuit diagram of an EEPROM according to the eighth embodiment;

FIG. 20 is a schematic cross sectional view of an EEPROM according to a tenth embodiment.

DETAILED DESCRIPTION OF THE PREFERRED EMBODIMENTS

There will now be described an embodiment of this invention with reference to the accompanying drawings.

First Embodiment

Figure 1:
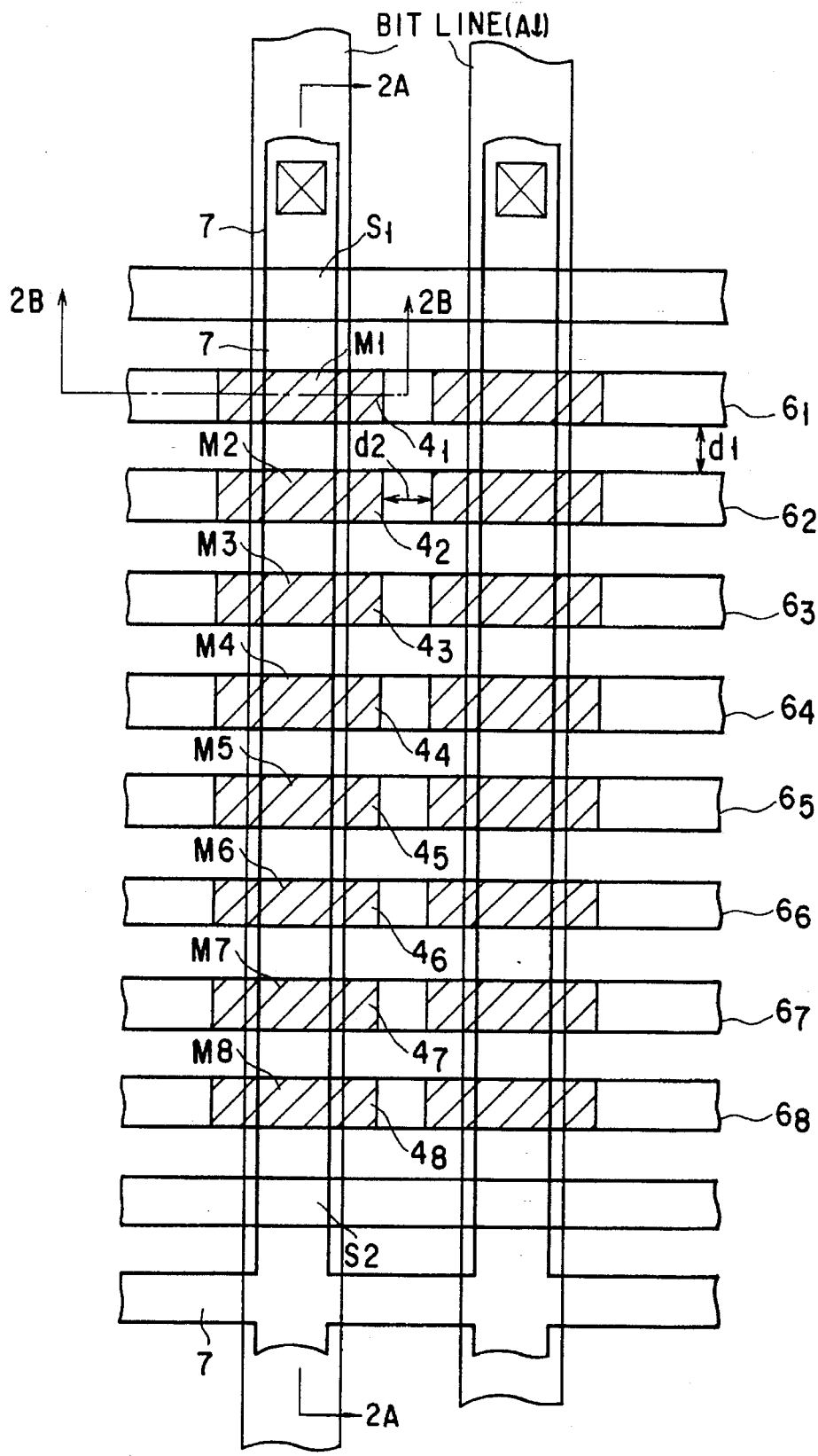
FIG. 1 is a plan view showing one NAND cell of a conventional EEPROM.
Figure 3:
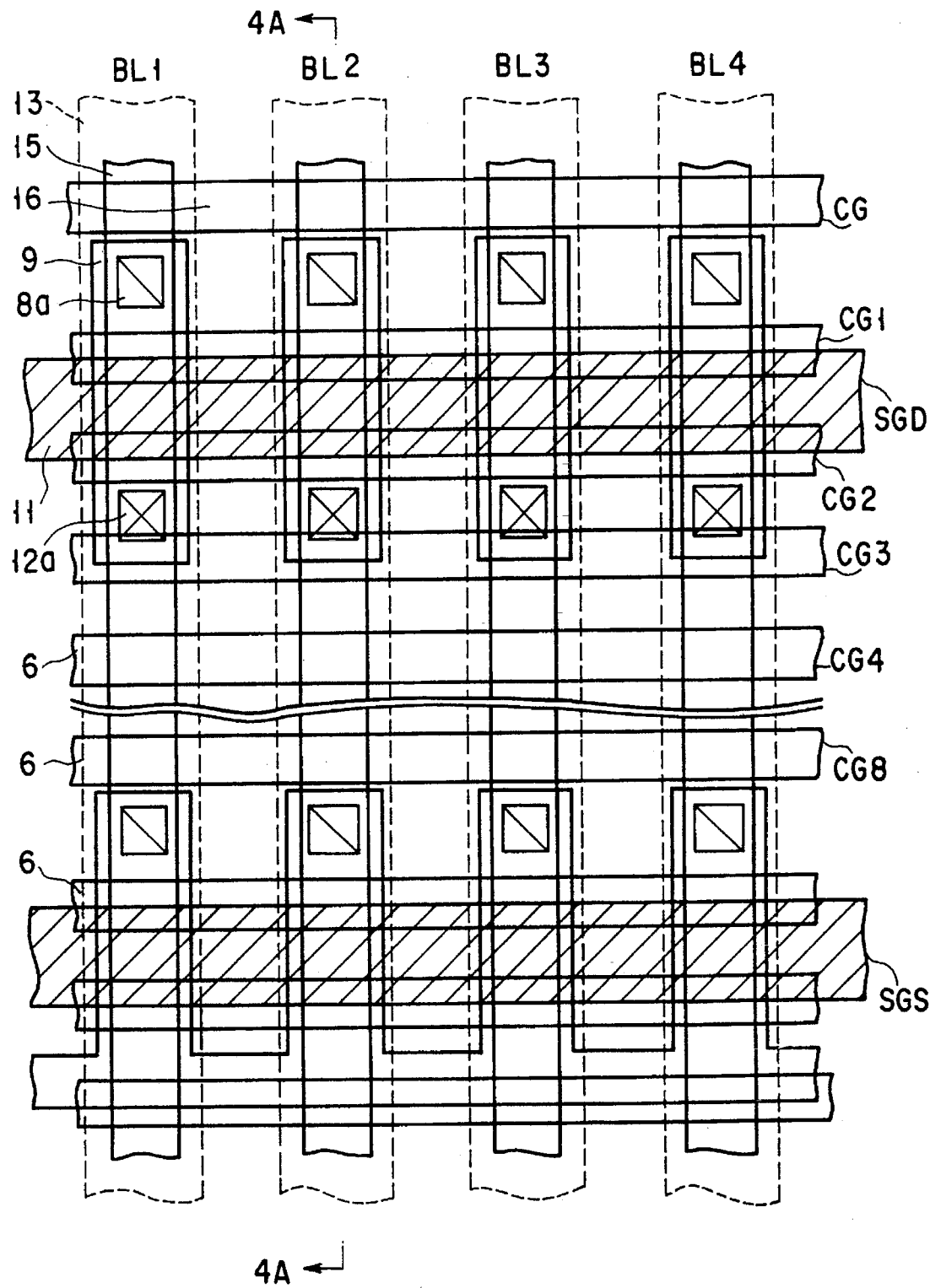
FIG. 3 is a plan view showing the schematic structure of a NAND-type cell EEPROM according to a first embodiment.
Figure 4:
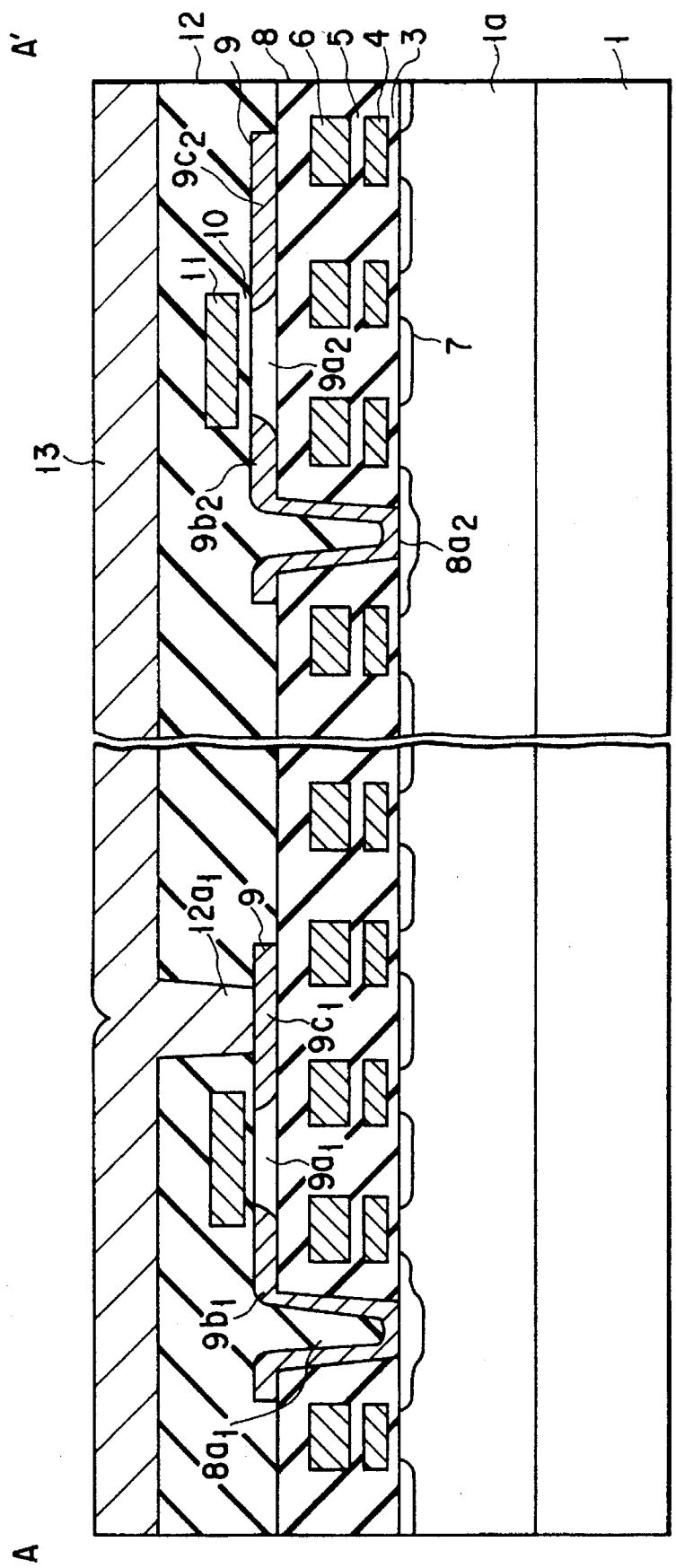
FIG. 4 is a cross sectional view taken along the line 4A—4A of FIG. 3.

FIG. 3 is a plan view showing the schematic structure of a NAND-type cell EEPROM according to a first embodiment of this invention, and FIG. 4 is a cross sectional view taken along the line 4A—4A of FIG. 3.

A p-type well 1a is formed on an n-type Si substrate 1 and element regions 15 and element separating regions 16 are alternately arranged in a stripe form on the p-type well 1a. Floating gates 4 (charge storage layers) are formed to extend in a direction which intersects the element regions 15 and element separating regions 16 at right angles over the p-type well 1a with first gate insulative films 3 disposed therebetween, and control gates 6 are formed over the respective floating gates with second gate insulative films 5 disposed therebetween.

Memory cells of MOS transistor structure are formed by forming $n^+$-type diffusion layers 7 by impurity diffusion into the p-type well 1a with the control gates 6 used as a mask. A preset number of the memory cells are serially connected to constitute a NAND cell.

A first interlayer insulative film 8 is deposited on the substrate having the NAND cells formed thereon and contact holes 8a are formed in the element regions for each of eight control gates 6, for example. An amorphous, polycrystalline silicon film or single crystal silicon film 9 is deposited on the first interlayer insulative film 8, and the silicon film 9 is processed into a preset form and part of the silicon film is connected to the $n^+$-type diffusion layers 7. Gate electrodes (selective gates) 11 are formed over portions of the silicon film 9 with gate insulative films 10 disposed therebetween and, for example, arsenic is ion-implanted into the silicon film 9 with the gate electrodes 11 used as a mask. As a result, selective transistors of TFT having channels 9a, sources 9b and drains 9c are formed.

A second interlayer insulative film 12 is deposited on the substrate having the selective transistors formed thereon and contact holes 12a for connecting the drains 9c of the selective transistors to bit lines are formed. Then, bit lines 13 are formed on the insulative films 12. As a result, the drain 9c of the selective transistor formed of TFT is connected to the bit line 13 and the source 9b thereof is connected to the drain side of the NAND cell.

The source 9b (9b$_1$, 9b$_2$) of the selective transistor connected to the source side is connected to the $n^+$-type diffusion layer 7 via the contact hole 8a (8a$_1$, 8a$_2$) and the drain 9c (9c$_1$, 9c$_2$) thereof is connected to the adjacent drain 9c$_2$ to act as a source line.

Figure 6:
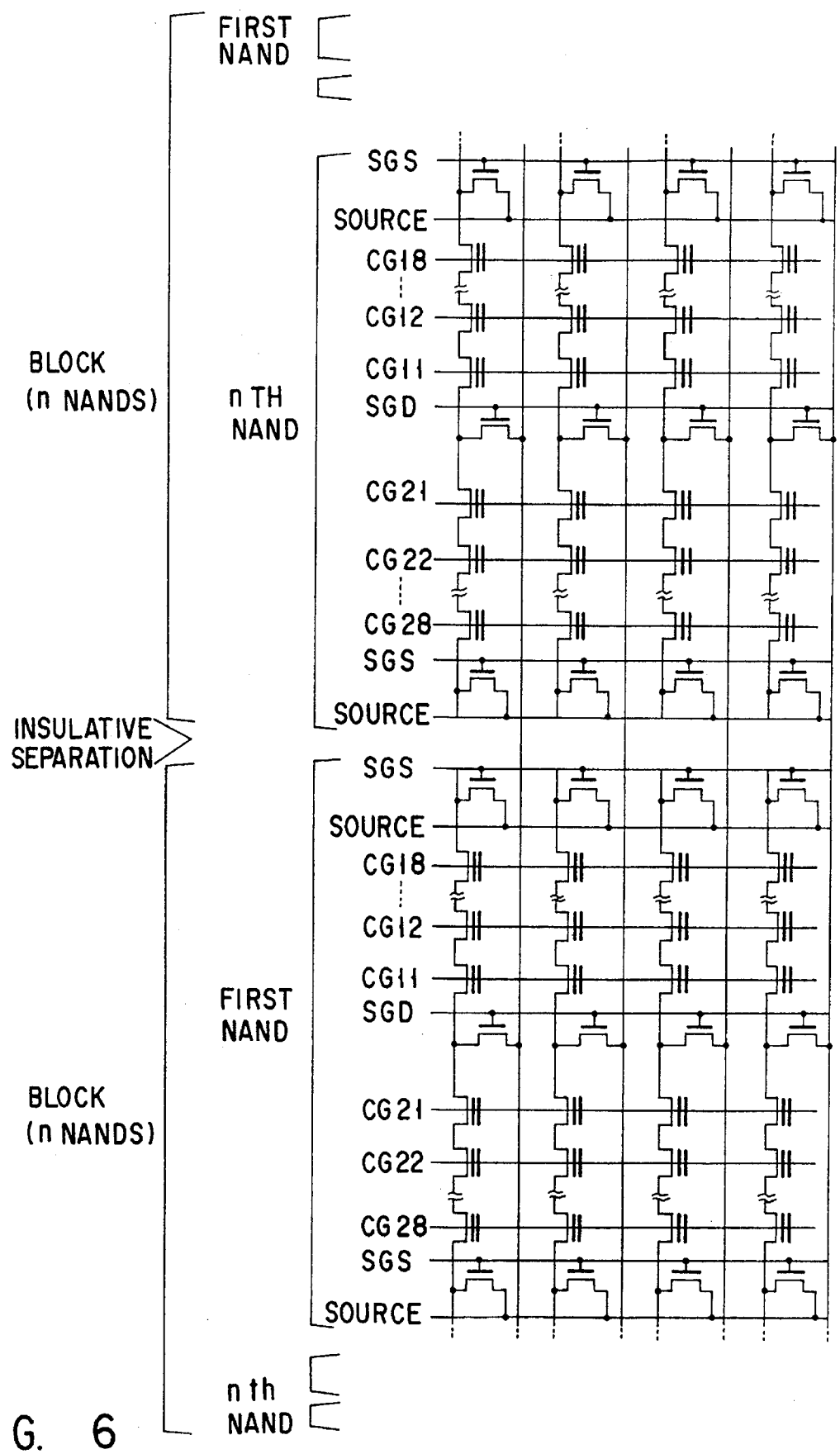
FIG. 6 is a diagram showing one example of the arrangement of a cell array in the first embodiment.

FIG. 5 is an equivalent circuit diagram of the cell array shown in FIGS. 3 and 4, and FIG. 6 shows one example of the arrangement of the cell array.

One drain-side selective transistor (connected to selective gate SGD) and one source-side selective transistor (connected to selective gate SGS) are arranged for each of two NAND cells and each of the selective transistors SGD, SGS is commonly used by at least two NAND cells. More specifically, a plurality of NAND cells are serially connected and the connection node thereof is connected to the selective transistor. The element regions ($n^+$-type diffusion layers) on the substrate are electrically connected to one another via a plurality of NAND cells in one block and the blocks are separated by separating the element regions from one another.

The following table 1 shows the operation of this embodiment. The write and erase operations of the NAND-type cell EEPROM are effected by transfer of charges by tunneling current between the substrate 1 and the floating gate 3.

TABLE 1

| | | Erase | Write | Read |
|---|---|---|---|---|
| Selected NAND in selected block | Selected BL | 0 or VM or Vpp | 0 | 1V |
| | Non-selected BL | 0 or VM or Vpp | VM | 1V |
| | SGD | 0 or Vpp | VM | Vcc |
| | CG1 | 0 | VM | Vcc |
| | CGn | 0 | Vpp | 0 |
| | CG8 | 0 | VM | Vcc |
| | SGS | 0 or Vpp | 0 | Vcc |
| Common | Source | 0 or Vpp | 0 | 0 |

TABLE 1-continued

| | | Erase | Write | Read |
|---|---|---|---|---|
| | p-well | Vpp | 0 | 0 |
| | n-substrate | Vpp | Vcc | Vcc |
| Non-selected NAND in selected block | Selected BL | 0 or VM or Vpp | 0 | 1V |
| | Non-selected BL | 0 or VM or Vpp | VM | 1V |
| | SGD | 0 or Vpp | 0 or VM | 0 |
| | CG1 | Vpp | VM | 0 |
| | CGn | Vpp | VM | 0 |
| | CG8 | Vpp | VM | 0 |
| | SGS | 0 or Vpp | 0 | 0 |
| Non-selected block | Selected BL | 0 or VM or Vpp | 0 | 1V |
| | Non-selected BL | 0 or VM or Vpp | VM | 1V |
| | SGD | 0 or Vpp | 0 | 0 |
| | CG1 | Vpp | 0 | 0 |
| | CGn | Vpp | 0 | 0 |
| | CG8 | Vpp | 0 | 0 |
| | SGS | 0 or Vpp | 0 | 0 |

Like the normal NAND cell operation, in the erase operation, a high potential Vpp is applied to the p-type well and the like, the potential of the control gate CG is set to 0 V, and charges in the floating gate are discharged into the substrate. In the cell which the erase operation is not effected, the potential of the control gate CG is set to Vpp to prevent discharge of charges. At the time of erasing, the potential of the selective gate SG may be set to 0 V and the potential of the bit line BL may be set to a potential of 0 V to approx. VM or the potential of the selective gate SG may be set to Vpp and the potential of the bit line BL may be set to approx. Vpp, but in a case where the potential of the selective gate SG is set to 0 V and the potential of the bit line BL is set to 0 V or VM, since Vpp is not applied to the transistors of a bit line decoder (column decoder), it is not necessary to form transistors of high withstanding voltage of bit line decoder. Therefore, the bit line decoder can be constructed only by use of transistors of low withstanding voltage, thereby significantly reducing the area.

As a simultaneous erasing method, the potentials of the control gates CG and selective gates SG of all of the memory cells are set to 0 V, and a high potential Vpp is applied to the bit lines BL connected to the drains of the NAND cells, the common source lines of the NAND cells and the substrate. In this case, charges are discharged from the floating gates into the substrate in all of the memory cells to set up the states "0" in which the threshold voltages thereof are shifted in a negative direction.

The write operation is effected in the same manner as the operation in the normal NAND cell. The write operation is sequentially effected starting from the source-side memory cell M8. First, the common source and source-side selective gate SGS are grounded, a high potential Vpp is applied to the control gate CG of the memory cell M8, and an intermediate potential VM is applied to the remaining control gates CG and drain-side selective gates SGD. As a result, the potential (0 V) of the bit line BL is transmitted to the drain of the memory cell M8, and electrons are injected into the floating gate from the drain diffusion layer in the memory cell M8 to shift the threshold voltage in a positive direction. That is, the write operation of "1" is effected. The data write operations are sequentially effected in an order of the memory cells M7, M6, - - - .

However, VM is applied to the control gate CG of the non-selected NAND of the selected block. This is because a voltage applied to the bit line BL is applied to the $n^+$-type diffusion layer in the same block. The potential of the drain-side selective gate SGD of the non-selected NAND of the selected block is set to 0 V, but VM may be applied to stably determine the potential of the diffusion layer (the same potential as that of the selected NAND).

The read operation is effected in the same manner as in the normal NAND cell. That is, the control gate CG and common source line of a selected memory cell are grounded, and a power supply potential is applied to the remaining control gates and selective gates to detect the presence or absence of current.

As described above, according to this embodiment, the selective transistor for connecting the NAND cell to the bit line and source line is formed as a TFT on the NAND cell and the following effects can be obtained.

(1) The occupied area of the selective transistor section is substantially eliminated, making it possible to reduce the size of the memory cell array.

(2) Only the tunnel oxide film of the memory cell is formed as the gate insulative film in the memory cell array and it becomes unnecessary to form the same separately from the selective transistor, thus making it possible to reduce the number of steps.

(3) In a case where the selective transistor is formed of two-layered polysilicon film, a step of forming contacts in the first-layer polysilicon film was necessary, but this step can be omitted.

(4) The area of the column decoder section can be markedly reduced.

(5) Since the selective transistor is formed of TFT, the substrate bias effect is eliminated so that the driving ability can be enhanced, VM can be lowered and the read speed can be enhanced.

(6) The degradation of punch-through breakdown voltage occurred by a reduction of gate length of the selective transistor can be prevented.

Figure 7:
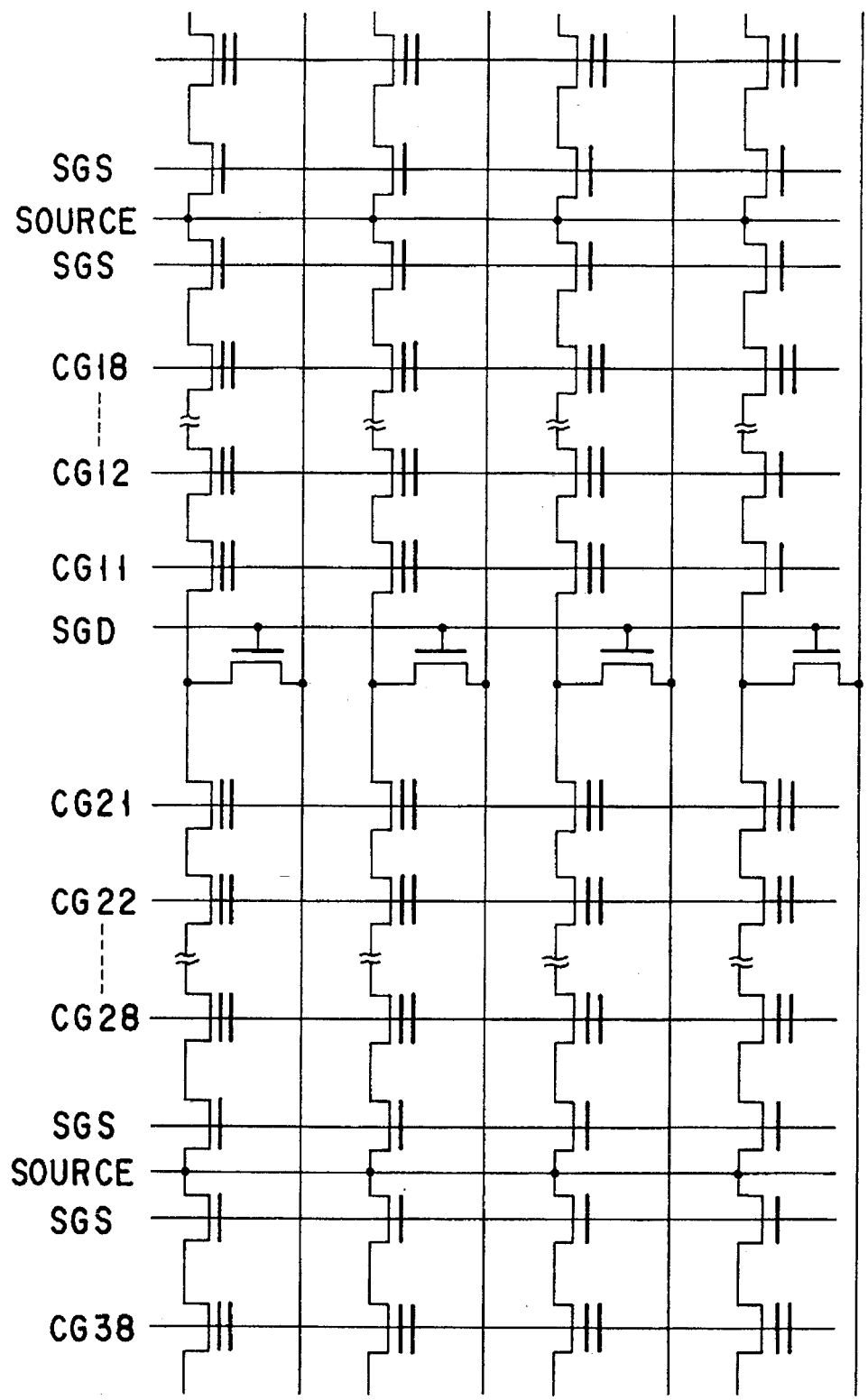
FIG. 7 is an equivalent circuit diagram showing a modification of the first embodiment.

As a modification of the first embodiment, the construction as shown in FIG. 7 can be employed. In this modification, like the conventional case, MOS transistors are used as selective transistors on the source side of the NAND cell and TFTs are used only for selective transistors on the drain side. In this case, the effect of reduction in the area of the memory cell array is reduced by half, but the diffusion layers can be separated in the same block.

Second Embodiment

Figure 9:
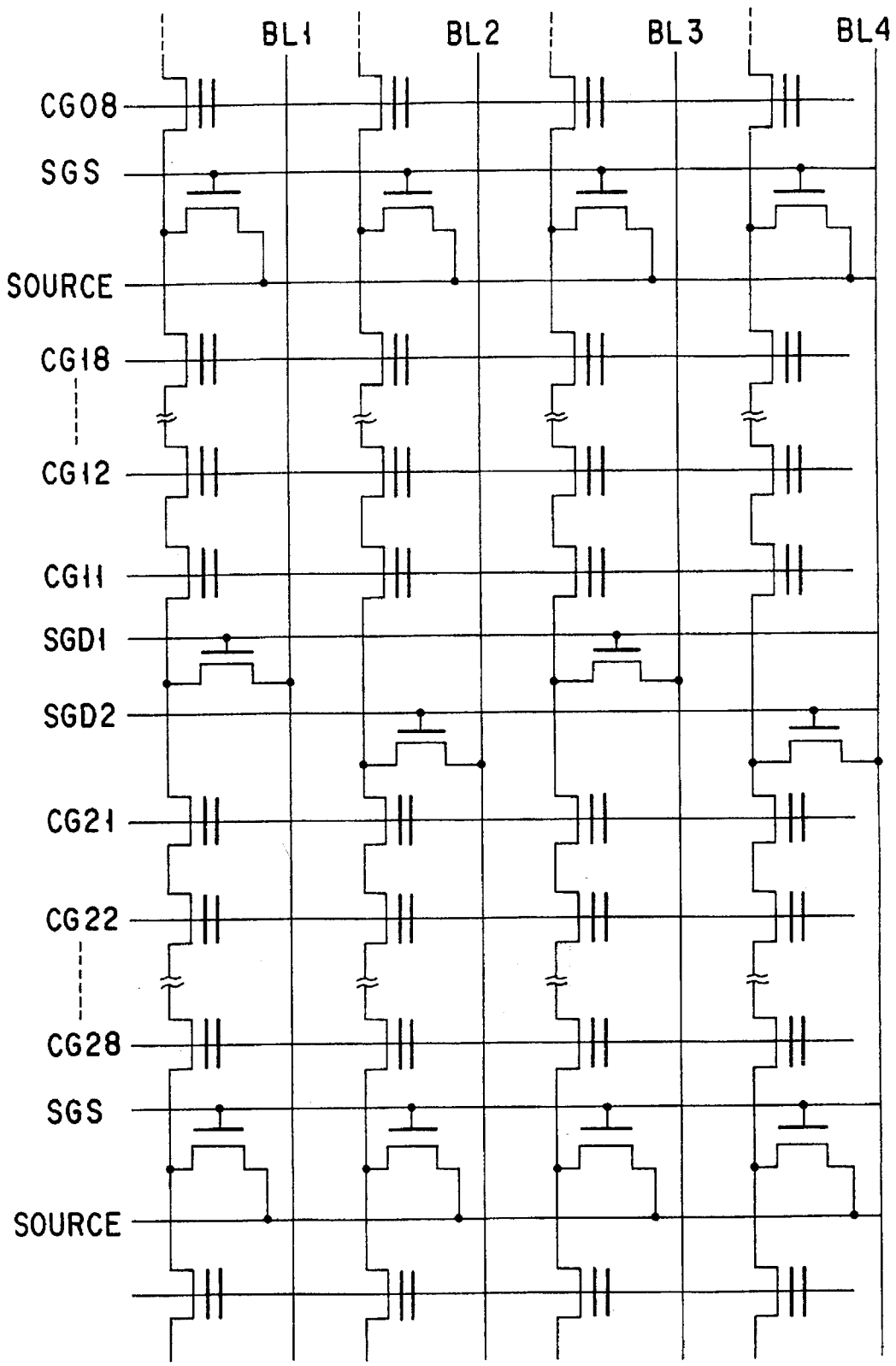
FIG. 9 is an equivalent circuit diagram of a cell array shown in FIG. 8.

FIG. 8 is a plan view showing the schematic structure of a NAND-type cell EEPROM according to a second embodiment of this invention, and FIG. 9 is an equivalent circuit thereof. Portions which are the same as those of FIG. 3 are denoted by the same reference numerals and the detail explanation therefor is omitted.

In this embodiment, the basic construction is the same as that of the first embodiment, but the bit line contact positions of the selective transistors are deviated from each other in the adjacent bit lines. That is, the silicon films on the bit line contact side are alternately formed in upper and lower positions of the respective substrate contacts. In this example, two selective gates are formed.

The operation of this embodiment is the same as that of the first embodiment, but in this embodiment, since the bit line contact positions are deviated, the margin for formation of Si and the margin for formation of the bit line contact portion can be increased.

Further, as shown in the table 2, the drain-side selective gates SGD1 and SGD2 can be respectively set to VH and 0 V at the time of writing. The diffusion layer of a cell connected to the source side of the drain-side selective gate SGD2 is set in the electrically floating state and the writing operation for the cell is not effected. Thus, it becomes possible to effect the writing operation only for half of the cells connected to one word line and the page size and block size can be reduced.

TABLE 2

|  |  | Erase | Write | Read |
|---|---|---|---|---|
| Selected NAND in selected block | Selected BL | 0 or VM or Vpp | 0 | 1V |
|  | Non-selected BL | 0 or VM or Vpp | VM | 1V |
|  | SGD1 | 0 or Vpp | VM | Vcc |
|  | SGD2 | 0 or Vpp | 0 | Vcc |
|  | CG1 | 0 | VM | Vcc |
|  | CGn | 0 | Vpp | 0 |
|  | CG8 | 0 | VM | Vcc |
|  | SGS | 0 or Vpp | 0 | Vcc |
| Common | Source | 0 or Vpp | 0 | 0 |
|  | p-well | Vpp | 0 | 0 |
|  | n-substrate | Vpp | Vcc | Vcc |
| Non-selected NAND in selected block | Selected BL | 0 or VM or Vpp | 0 | 1V |
|  | Non-selected BL | 0 or VM or Vpp | VM | 1V |
|  | SGD1 | 0 or Vpp | 0 or VM | 0 |
|  | SGD2 | 0 or Vpp | 0 or VM | 0 |
|  | CG1 | Vpp | VM | 0 |
|  | CGn | Vpp | VM | 0 |
|  | CG8 | Vpp | VM | 0 |
|  | SGS | 0 or Vpp | 0 | 0 |
| Non-selected block | Selected BL | 0 or VM or Vpp | 0 | 1V |
|  | Non-selected BL | 0 or VM or Vpp | VM | 1V |
|  | SGD | 0 or Vpp | 0 | 0 |
|  | CG1 | Vpp | 0 | 0 |
|  | CGn | Vpp | 0 | 0 |
|  | CG8 | Vpp | 0 | 0 |
|  | SGS | 0 or Vpp | 0 | 0 |

Also, in this embodiment, it is possible to use MOS transistors on the substrate as the source-side selective transistors as in the conventional case and use TFTs only for the drain-side selective transistors as shown in FIG. 7.

Third Embodiment

FIG. 10 is a plan view showing the schematic structure of a NAND-type cell EEPROM according to a third embodiment of this invention, and FIG. 11 is an equivalent circuit thereof. Portions which are the same as those of FIG. 3 are denoted by the same reference numerals and the detail explanation therefor is omitted.

The source-side selective transistor is the same as that of the first embodiment. The drain-side selective transistor is the same as that of the second embodiment, but the bit line connecting method is different. That is, the bit line is commonly connected to adjacent two NAND cells and one of the NAND cells can be selected by selecting one of the selective gates SGD1 and SGD2. The operation of this embodiment is as follows as shown in the table 3.

TABLE 3

|  |  | Erase | Write | Read |
|---|---|---|---|---|
| Selected NAND in selected block | Selected BL | 0 or VM or Vpp | 0 | 1V |
|  | Non-selected BL | 0 or VM or Vpp | VM | 1V |
|  | SGD1 | 0 or Vpp | VM | Vcc |
|  | SGD2 | 0 or Vpp | 0 | 0 |
|  | CG1 | 0 | VM | Vcc |

TABLE 3-continued

| | | Erase | Write | Read |
|---|---|---|---|---|
| | CGn | 0 | Vpp | 0 |
| | CG8 | 0 | VM | Vcc |
| | SGS | 0 or Vpp | 0 | Vcc |
| Common | Source | Vpp | 0 | 0 |
| | p-well | Vpp | 0 | 0 |
| | n-substrate | Vpp | Vcc | Vcc |
| Non-selected NAND in selected block | Selected BL | 0 or VM or Vpp | 0 | 1V |
| | Non-selected BL | 0 or VM or Vpp | VM | 1V |
| | SGD1 | 0 or Vpp | 0 | 0 |
| | SGD2 | 0 or Vpp | 0 | 0 |
| | CG1 | Vpp | VM | 0 |
| | CGn | Vpp | VM | 0 |
| | CG8 | Vpp | VM | 0 |
| | SGS | 0 or Vpp | 0 | 0 |
| Non-selected block | Selected BL | 0 or VM or Vpp | 0 | 1V |
| | Non-selected BL | 0 or VM or Vpp | VM | 1V |
| | SGD1 | 0 or Vpp | 0 | 0 |
| | SGD2 | 0 or Vpp | 0 | 0 |
| | CG1 | Vpp | 0 | 0 |
| | CGn | Vpp | 0 | 0 |
| | CG8 | Vpp | 0 | 0 |
| | SGS | 0 or Vpp | 0 | 0 |

In this embodiment, the same effect as that of the first embodiment can be obtained, and in addition, an advantage that the margin for design of the bit lines is increased and the capacitance between the bit lines can be reduced can be obtained by improving the bit line connecting method. In addition, The design rule of the bit line decoder and the sense amplifier can be relaxed, and the occupied area can be reduced.

Fourth Embodiment

Figure 12:
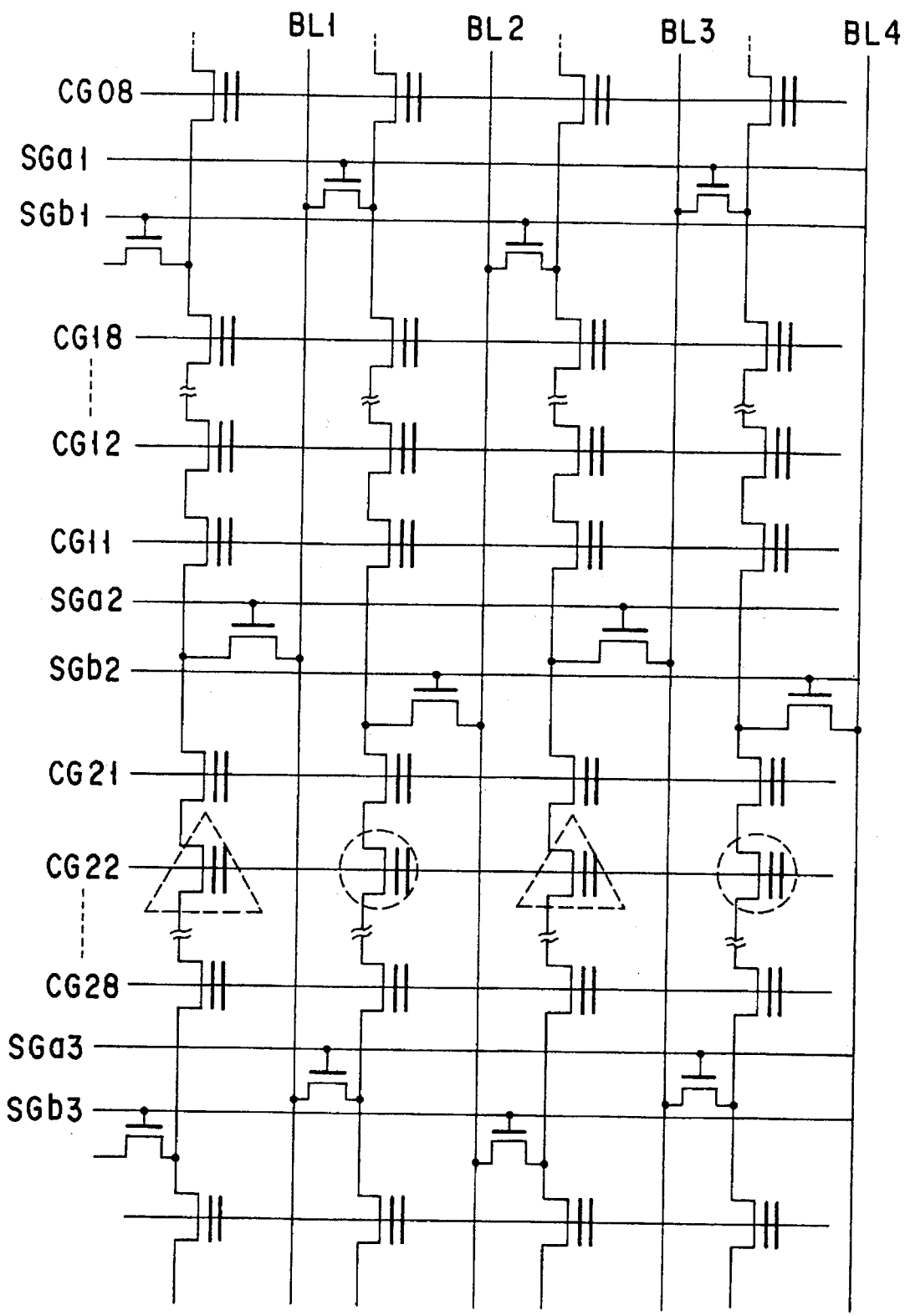
FIG. 12 is an equivalent circuit diagram of a NAND-type cell EEPROM according to a fourth embodiment.

FIG. 12 is an equivalent circuit diagram of a NAND-type cell EEPROM according to a fourth embodiment of this invention. Portions which are the same as those of FIG. 3 are denoted by the same reference numerals and the detail explanation therefor is omitted.

In this embodiment, the source line is omitted and the bit line is substituted therefor. That is, all of the drain sides and source sides of the NAND cells are connected to the bit lines via selective transistors. Adjacent selective transistors (for example, SGa2, SGb2) are not simultaneously turned ON and, for example, in a case where data is read out from a cell indicated by the O mark in FIG. 12, SGa2 is set OFF when SGb2 is set ON, and at this time, SGa3 is set ON so that a current will flow from BL2 into BL1 or from BL4 into BL3. Thus, the adjacent bit lines BL act as the bit line and source line.

As described above, the read operation is simultaneously effected for each of the adjacent cells. In a case where data is read out from an adjacent cell, for example, in a case where data is read out from a cell indicated by the Δ mark, SGa2 and SGb3 are simultaneously set ON so that a current will flow from BL1 into BL0 (not shown) or from BL3 into BL2.

In a case where data is read out from a cell indicated by the O mark, data may also be read out by setting SGb2 and SGa3 ON like the above case and applying a voltage of 1 V, for example, to BL1 so as to pass a current from BL1 into BL2. That is, data can be read out from the cell indicated by the O mark from either BL1 or BL2.

The operation of this embodiment is as follows as indicated by the table 4. The sector erase and partial erase indicate a case where the erasing operations are effected for cells connected to CG21 to CG28.

TABLE 4

| | Simultaneous erase | Sector erase (Partial erase) | Write "0" | Write "1" | Read |
|---|---|---|---|---|---|
| BL1 | 0 or VM or Vpp | Same as left column | 0 | VM | 0 |
| BL2 | 0 or VM or Vpp | | 0 | VM | 1V |
| BL3 | 0 or VM or Vpp | | 0 | VM | 0 |
| BL4 | 0 or VM or Vpp | | 0 | VM | 1V |
| SGa1 | 0 or VM or Vpp | Same as left column | 0 | 0 | 0 |
| SGb1 | 0 or VM or Vpp | | 0 | 0 | 0 |
| SGa2 | 0 or VM or Vpp | | 0 | 0 | 0 |
| SGb2 | 0 or VM or Vpp | | VM | Vcc | |
| SGa3 | 0 or VM or Vpp | | VM | Vcc | |
| SGb4 | 0 or VM or Vpp | | 0 | 0 | |
| CG11 to CG18 | 0 | Vpp | VM | 0 | |
| | 0 | Vpp | VM | 0 | |
| CG21 | 0 | Vpp | VM | Vcc | |
| CG22 | 0 | Vpp | Vpp | 0 | |
| CG23 to CG28 | 0 | Vpp | VM | Vcc | |
| | 0 | Vpp | VM | Vcc | |
| p-well | Vpp | Same as left column | 0 | 0 | |
| n-sub. | Vpp | | Vcc | Vcc | |

In this case, an example that Vpp is applied to the well to effect the erase operation is explained, but a method of applying Vpp to the drain or the source can be used. Further, a write method using hot electrons can be used.

Fifth Embodiment

Figure 13:
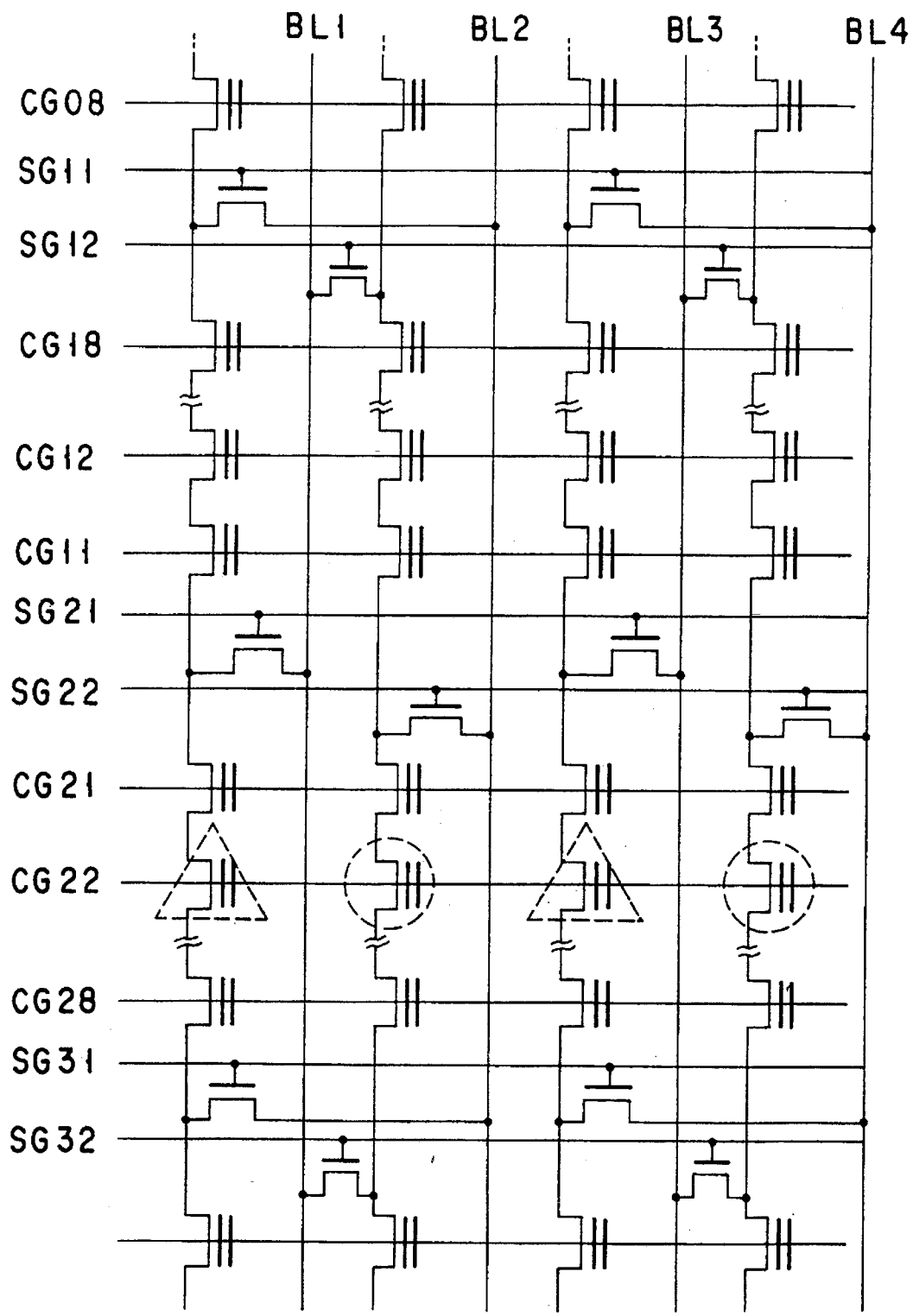
FIG. 13 is an equivalent circuit diagram of a NAND-type cell EEPROM according to a fifth embodiment.

FIG. 13 is an equivalent circuit diagram of a NAND-type cell EEPROM according to a fifth embodiment of this invention. Portions which are the same as those of FIG. 3 are denoted by the same reference numerals and the detail explanation therefor is omitted.

Unlike the case of the fourth embodiment, in this embodiment, adjacent bit lines BL are connected in a complementary form. That is, selective transistors connected to SG22 and SG32 are simultaneously set ON to permit data read from cells indicated by the O mark and selective transistors connected to SG21 and SG31 are simultaneously set ON to permit data read from cells indicated by the Δ mark. In this case, the bit lines are used as source lines.

Sixth Embodiment

Figure 14:
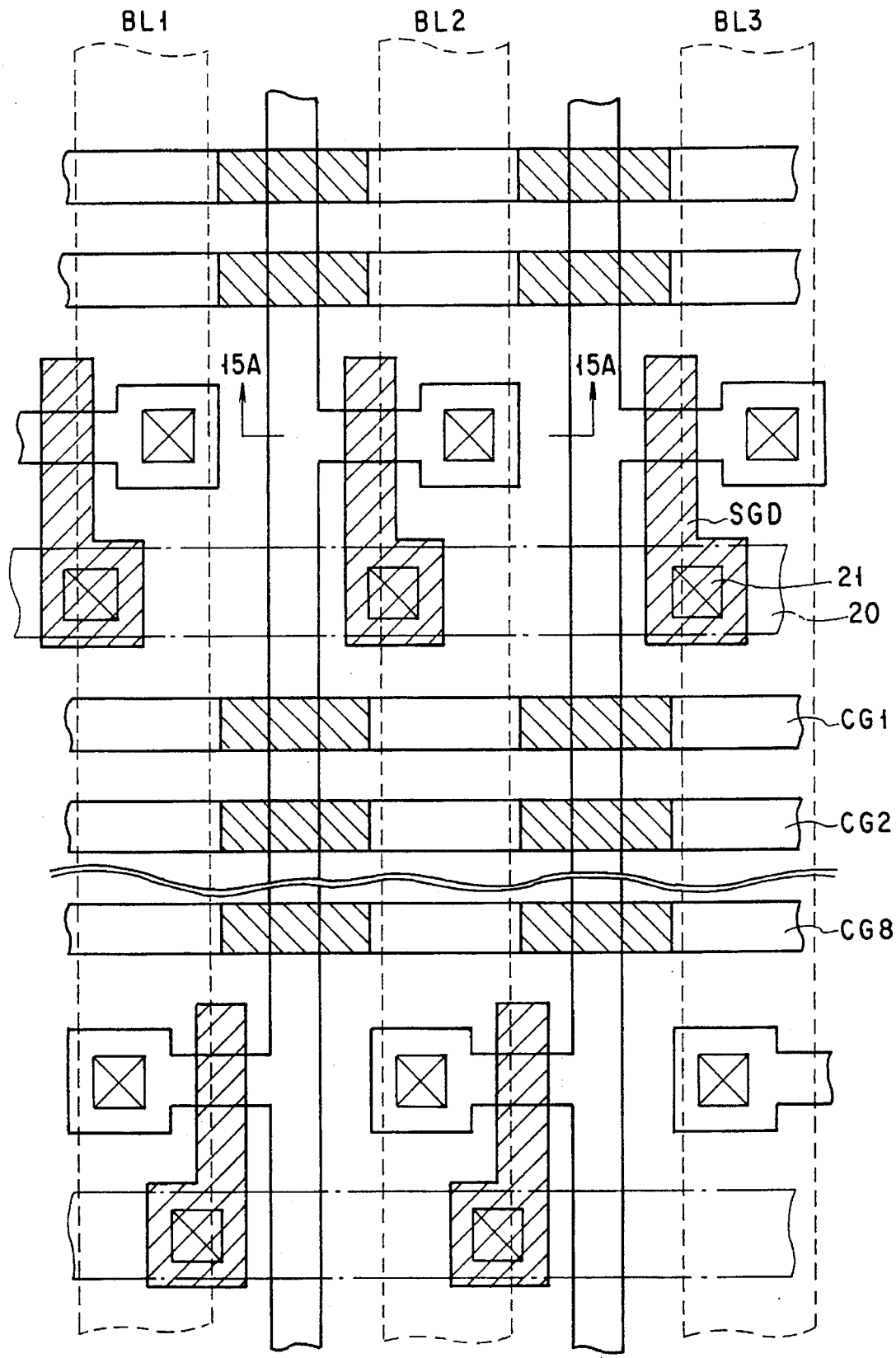
FIG. 14 is a plan view showing the schematic structure of a NAND-type cell EEPROM according to a sixth embodiment.

FIG. 14 is a plan view showing the schematic structure of a NAND-type cell EEPROM according to a sixth embodiment of this invention.

Like the fourth embodiment, in this embodiment, source lines are omitted and bit lines are used instead of them. This embodiment has a feature in the selective transistor section. In this embodiment, the selective transistors are formed on the substrate and the electrodes of the selective gates are connected to an interconnection layer 20 (for example, polycrystalline silicide interconnection layer) via contact holes. By this connection method, the bit line capacitance can be reduced (the capacitance between the selective gate electrode and the diffusion layer can be reduced) and the source line can be connected to the adjacent bit line BL2 so that the source resistance can be reduced and the high-speed access can be attained.

Figure 15:
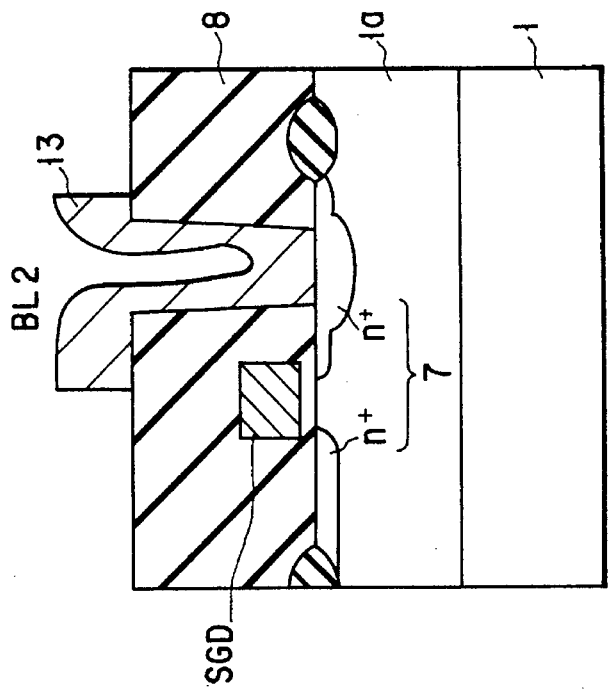
FIG. 15 is a cross sectional view taken along the line 15A—15A of FIG. 14.

FIG. 15 is a cross sectional view taken along the line 15A—15A of FIG. 14. It is connected to the bit line BL2 via the selective gate SGD.

The operation of this embodiment is the same as that of the fourth embodiment, and therefore, the explanation therefor is omitted.

Seventh Embodiment

Figure 16:
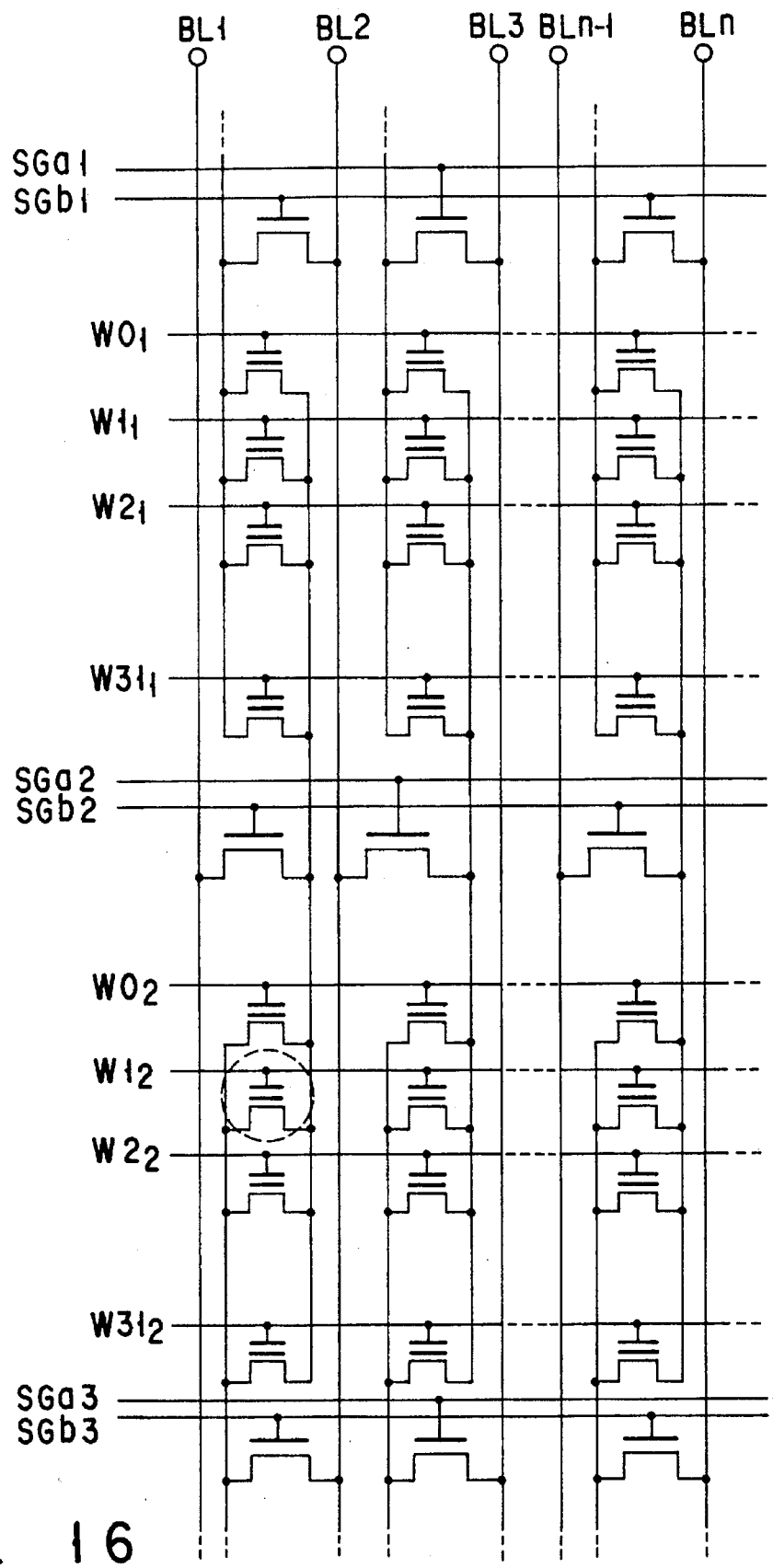
FIG. 16 is an equivalent circuit diagram of a NAND-type cell EEPROM according to a seventh embodiment.

FIG. 16 is an equivalent circuit diagram of an EEPROM according to a seventh embodiment of this invention. Portions which are the same as those of FIG. 5 are denoted by the same reference numerals and the detail explanation therefor is omitted.

In this embodiment, memory cells are connected in parallel and diffusion layers on one side thereof are connected to a bit line via a selective transistor. With this connection, a source line is omitted and the bit line is used instead of the source line. That is, all of the drain sides and source sides of the parallel-connected cells are connected to the bit lines via the respective selective transistors. The adjacent selective transistors (for example, SGa2, SGb2) are not simultaneously turned ON, and in a case where data is read out from the cell indicated by the ○ mark of FIG. 16, for example, SGa2 is set OFF when SGb2 is set ON, and at this time, SGb3 is set ON so as to permit a current to flow from BL1 into BL2. Thus, the adjacent bit lines BL act as the bit line and source line.

The parallel cell can be used by replacing NAND-type cell used in the first to sixth embodiments.

The operation of this embodiment is as follows as shown in the table 5. The sector erase and partial erase indicate a case where the erasing operation is effected for cells connected to CG21 to CG28. Another operation is shown in table 6. This operation indicates that the electron is injected to the floating gate at erase operation and the electron is extracted onto the drain at write operation.

TABLE 5

|  | Simultaneous erase | Sector erase (Partial erase) | Write "0" | Write "1" | Read |
|---|---|---|---|---|---|
| BL1 | 0 or VM or Vpp | Same as left column | 0 | VM | 1V |
| BL2 | 0 or VM or Vpp |  | 0 | VM | 0 |
| BL3 | 0 or VM or Vpp |  | 0 | VM | 1V |
| BLn-1 | 0 or VM or Vpp |  | 0 | VM | 1V |
| BLn | 0 or VM or Vpp |  | 0 | VM | 0 |
| SGa1 | 0 or VM or Vpp | Same as left column | 0 | 0 | 0 |
| SGb1 | 0 or VM or Vpp |  | 0 | 0 | 0 |
| SGa2 | 0 or VM or Vpp |  | 0 | 0 | 0 |
| SGb2 | 0 or VM or Vpp |  | VM | Vcc |  |
| SGa3 | 0 or VM or Vpp |  | 0 | 0 |  |
| SGb3 | 0 or VM or Vpp |  | VM | Vcc |  |
| W01 to W311 | 0 | Vpp | VM | 0 |  |
| W02 | 0 | 0 | VM | 0 |  |
| W12 | 0 | 0 | Vpp | Vcc |  |
| W22 to W312 | 0 | 0 | VM | 0 |  |
| p-well | Vpp | Same as left column | 0 | 0 |  |
| n-sub. | Vpp |  | Vcc | Vcc |  |

TABLE 6

|  | Simultaneous erase | Sector erase (Partial erase) | Write "0" | Write "1" | Read |
|---|---|---|---|---|---|
| BL1 | 0 | Same as left column | 0 | VM (or Vcc) | 1V |
| BL2 | 0 |  | 0 | VM (or Vcc) | 0 |
| BL3 | 0 |  | 0 | VM (or Vcc) | 1V |
| BLn-1 | 0 |  | 0 | VM (or Vcc) | 1V |
| BLn | 0 |  | 0 | VM (or Vcc) | 0 |
| SGa1 | VM (or Vcc) | Same as left column | 0 | 0 |  |
| SGb1 | VM (or Vcc) |  | 0 | 0 |  |
| SGa2 | VM (or Vcc) |  | 0 | 0 |  |
| SGb2 | VM (or Vcc) |  | VM | Vcc |  |
| SGa3 | VM (or Vcc) |  | 0 | 0 |  |
| SGb4 | VM (or Vcc) |  | VM | Vcc |  |
| W011 to W311 | Vpp | 0 | VM (or Vcc) | 0 |  |
| W02 | Vpp | 0 | VM (or Vcc) | 0 |  |
| W12 | Vpp | Vpp | -VM' | Vcc |  |
| W22 to W312 | Vpp | Vpp | VM (or Vcc) | 0 |  |
| p-well | 0 | Same as left column | 0 | 0 |  |
| n-sub. | Vcc |  | Vcc | Vcc |  |

Eighth Embodiment

Figure 17:
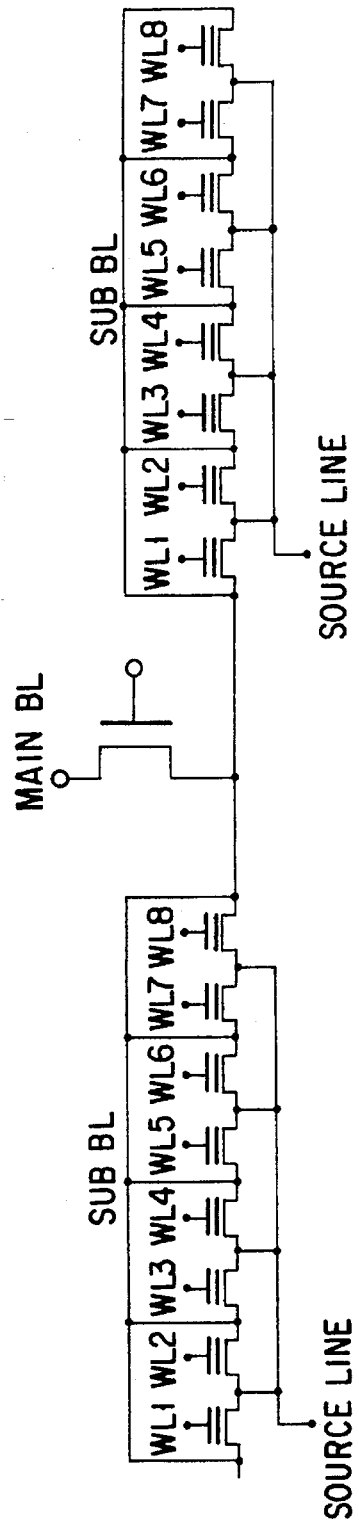
FIG. 17 is an equivalent circuit diagram of an EEPROM according to an eighth embodiment.

FIGS. 17 and 18 are equivalent circuit diagrams of an EEPROM according to an eighth embodiment. Portions which are the same as those of FIG. 5 are denoted by the same reference numerals and the detail explanation therefor is omitted.

In this embodiment, memory cells are connected in parallel via a sub-bit line and diffusion layers on one side thereof are connected to a bit line via a selective transistor. By this connection, the drain sides of the parallel-connected cells are connected to the bit line via the selective transistor.

The operation of this embodiment is as follows as shown in the table 7. The sector erase and partial erase indicate a case where the erasing operation is effected for cells connected to CG21 to CG28. Another operation is shown in table 8. This operation indicates that the electron is injected to the floating gate at erase operation and the electron is extracted onto the drain at write operation.

TABLE 7

|  | Simultaneous erase | Sector erase (Partial erase) | Write "0" | Write "1" | Read |
|---|---|---|---|---|---|
| BL1 | 0 or VM or Vpp | Same as left column | 0 | VM | 1V |
| BL2 | 0 or VM or Vpp |  | 0 | VM | 0 |
| BL3 | 0 or VM or Vpp |  | 0 | VM | 0 |
| BLn-1 | 0 or VM or Vpp |  | 0 | 0 | 1V |
| BLn | 0 or VM or Vpp |  | 0 | VM | 0 |
| ST1 | 0 or VM or Vpp |  | 0 |  | Vcc |
| ST2 | 0 or VM or Vpp |  | 0 |  |  |
| W011 to W311 | 0 | Vpp | VM (Vcc) | 0 |  |
| W02 | 0 | Vpp | VM (Vcc) | 0 |  |
| W12 | 0 | 0 | VM | 0 |  |
| W22 to W312 | 0 | 0 | VM | Vcc |  |
| p-well | Vpp | Same as left column | VM | 0 |  |
| n-sub. | Vpp | column | 0 | 0 |  |
|  |  |  | Vcc | Vcc |  |

TABLE 8

| | Simultaneous erase | Sector erase (Partial erase) | Write "0" | Write "1" | Read |
|---|---|---|---|---|---|
| BL1 | 0 | Same as left column | 0 | VM | 1V |
| BL2 | 0 | | 0 | VM | 1V |
| BL3 | 0 | | 0 | VM | 1V |
| BLn-1 | 0 | | 0 | VM | 1V |
| BLn | 0 | | 0 | VM | 1V |
| ST1 | VM (or Vcc) | | 0 | | 0 |
| ST2 | VM (or Vcc) | | 0 | | 0 |
| W011 to W311 | Vpp | 0 | 0 | | 0 |
| | Vpp | 0 | 0 | | 0 |
| W02 | Vpp | Vpp | 0 | | 0 |
| W12 | Vpp | Vpp | −VM" | | Vcc |
| W22 | Vpp | Vpp | 0 | | 0 |
| to W312 | Vpp | Vpp | 0 | | 0 |
| p-well | −VM' | Same as left column | 0 | | 0 |
| n-sub. | Vcc | | Vcc | | Vcc |
| Source | −VM' | −VM' | Floating | | 0 |

Ninth Embodiment

Figure 19:
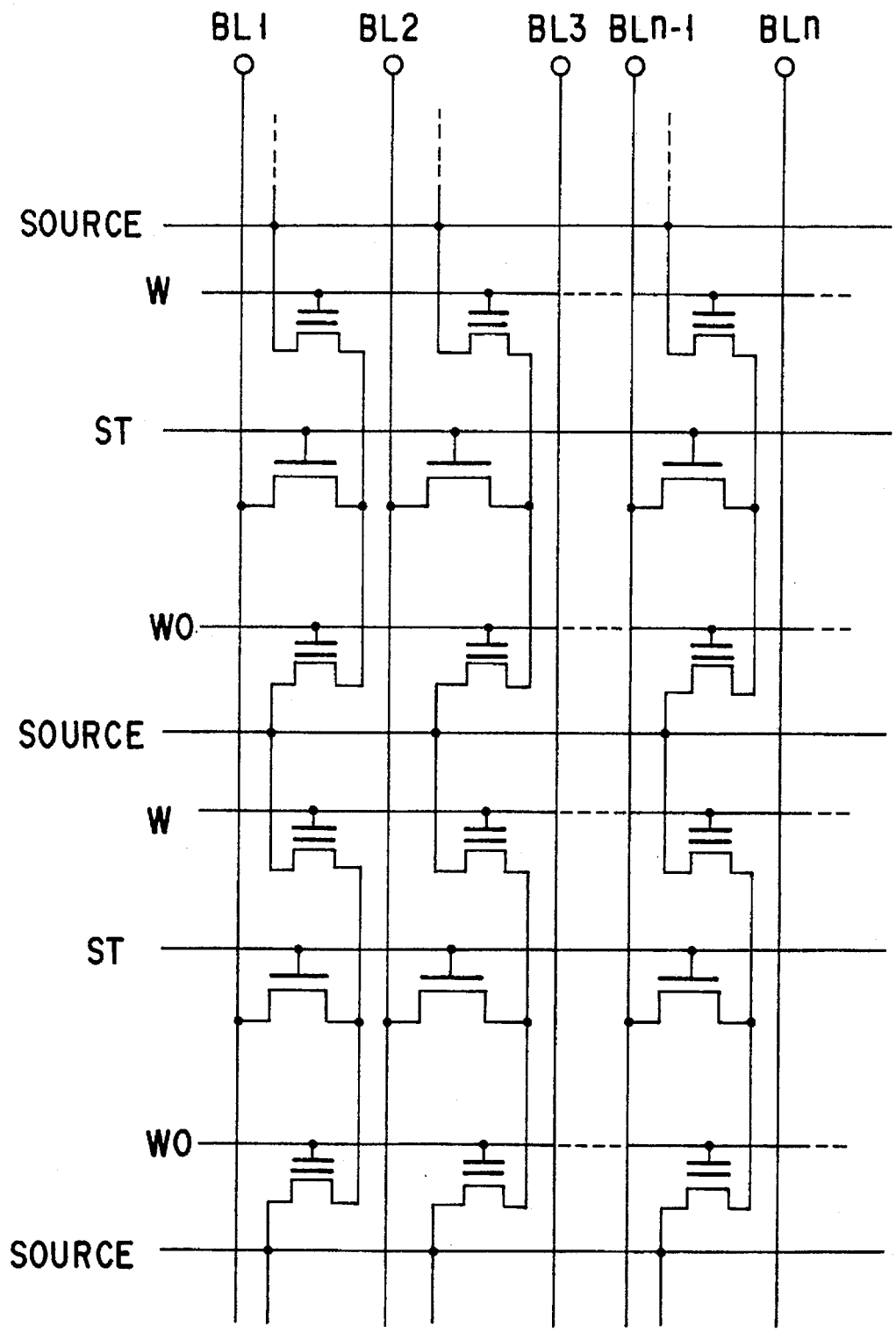
FIG. 19 is an equivalent circuit diagram of an EEPROM according to a ninth embodiment.

FIG. 19 is an equivalent circuit diagram of an EEPROM according to a ninth embodiment. Portions which are the same as those of FIG. 5 are denoted by the same reference numerals and the detail explanation therefor is omitted.

In this embodiment, a selective transistor is added to a NOR type memory cell and the drain of the memory cell is connected to a bit line via the selective transistor. The operation of the cell is the same as the operation of the normal NOR and is effected by a method of writing data by use of hot electrons and extracting them into the source side via an FN tunnel.

This embodiment has an advantage that the bit line capacitance can be reduced and the disturbance mode can be reduced by addition of the selective transistor.

Tenth Embodiment

FIG. 20 is a schematic cross sectional view of an EEPROM according to a tenth embodiment of this invention. Portions which are the same as those of FIG. 4 are denoted by the same reference numerals and the detail explanation therefor is omitted.

In this embodiment, TFT transistors formed in the memory cell section are arranged in an area other than an area of the memory cells (peripheral circuit portion).

In this embodiment, the area occupied by the peripheral circuit portion is reduced and the degree of freedom for circuit connection is increased.

This invention is not limited to the above embodiments. In the above embodiments, the NAND-type cell EEPROM is explained as an example, but this invention can also be applied to various types of EEPROMs having selective gates. More specifically, this invention is not limited to the control gate type EEPROM, but can be applied to a EEPROM and a NAND type EEPROM using MNOS type memory cells. Further, this invention can be applied to a so-called mask ROM which is different from the EEPROM and which uses MOS transistors having information fixedly stored by channel ion-implantation or the like as memory cells.

Further, this invention can also be applied to the FACE type, the ground array type having bit lines of diffusion layer in addition to the AND type and DINOR type having sub-bit lines described above. In addition, this invention can be variously modified without departing the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a semiconductor substrate;

a word line arranged in a predetermined direction;

a plurality of memory cell units each having a plurality of memory cells each of which has a charge storage layer and a control gate stacked on said semiconductor substrate and in which the write and erase operations are effected by transferring charges between said charge storage layer and said semiconductor substrate as one unit;

a plurality of data lines arranged in a direction crossing said word line and for transferring data with respect to said plurality of memory cell units; and a plurality of selective transistors arranged between said plurality of memory cell units and said plurality of data lines and each having a first end connected to a corresponding one of said plurality of memory cell units and a second end connected to a corresponding one of said plurality of data lines, and wherein said first end of each of said plurality of selective transistors are shared by adjacent memory cell units in a data line direction.

2. A semiconductor memory device according to claim 1, wherein said memory cell units are divided into a plurality of blocks, and each block is constituted by a predetermined number of said plurality of memory cell units and is electrically separated with each other.

3. A semiconductor memory device according to claim 1, wherein a cell current from said data line flows to one of said adjacent memory cell units via said selective transistor of which said first end is shared by said adjacent memory cell units.

4. A semiconductor memory device according to claim 1, wherein gates of adjacent selective transistors arranged in word line direction are commonly connected to a selective gate line.

5. A semiconductor memory device according to claim 1, wherein gates of adjacent selective transistors arranged in word line direction are separately connected to a selective gate line.

6. A semiconductor memory device according to claim 1, wherein said memory cell units are electrically separated except for connecting ends of said selective transistors.

7. A semiconductor memory device according to claim 1, wherein said plurality of selective transistors include first and second selective transistors which are adjacent in a word line direction, the adjacent memory cell units arranged in a word line direction are connected to the same data line via said first and second selective transistors, respectively, and a desired one of said memory cell units is operated by rendering one of said first and second selective transistors connected to said same data line conductive to selecting one of said adjacent memory cell units.

8. A semiconductor memory device according to claim 1, further comprising second selective transistors connected between said plurality of memory cell units and a common source line.

9. A semiconductor memory device according to claim 1, wherein each of said plurality of memory cell units has a first end connected to a corresponding one of said plurality of data lines via a corresponding one of said plurality of selective transistors and a second end connected to a different one of said plurality of data lines via a different one of said plurality of selective transistors.

10. A semiconductor memory device according to claim 1, wherein both ends of a first memory cell unit are respectively connected to first and second selective transistors and both ends of a second memory cell unit adjacent to said first memory cell unit in a word line direction are respectively connected to third and fourth selective transistors, and said first and said fourth selective transistors are connected to a first data line and said second and said third selective transistors are connected to a second data line.

11. A semiconductor memory device according to claim 1, wherein said plurality of selective transistors are formed of thin film transistors having thin film semiconductor layers formed on said plurality of memory cell units as channel sections.

12. A semiconductor memory device according to claim 1, wherein each of said plurality of memory cell units has a series-connected structure of which a plurality of memory cells are connected in series.

13. A semiconductor memory device according to claim 1, wherein each of said plurality of memory cell units has a parallel-connected structure of which a source and drain of each of a plurality of memory cells are connected to each other.

14. A semiconductor memory device comprising: a semiconductor substrate;

a plurality of memory cell units each having a plurality of memory cells each of which has a charge storage layer and a control gate stacked on said semiconductor substrate and in which the write and erase operations are effected by transferring charges between said charge storage layer and said semiconductor substrate as one unit;

a plurality of selective transistors constructed by thin film transistors which have thin film semiconductor layers formed on said plurality of memory cell units as channel sections, each transistor functioning to select a corresponding memory cell unit connected thereto; and a plurality of data lines connected to said plurality of memory cell units by said plurality of selective transistors being selected.

15. A semiconductor memory device according to claim 14, wherein said memory cell units are divided into a plurality of blocks, and each block is constituted by a predetermined number of said plurality of memory cell units and is electrically separated with each other.

16. A semiconductor memory device according to claim 14, wherein said plurality of selective transistors include first and second selective transistors which are adjacent to each other, the adjacent memory cell units are connected to the same data line via said first and second selective transistors, respectively, and a desired one of said memory cell units is operated by rendering one of said first and second selective transistors connected to said same data line conductive to selecting one of said adjacent memory cell units.

17. A semiconductor memory device according to claim 14, wherein each of said plurality of memory cell units has a first end connected to a corresponding one of said plurality of data lines via a corresponding one of said plurality of selective transistors and a second end connected to a different one of said plurality of data lines via a different one of said plurality of selective transistors.

18. A semiconductor memory device according to claim 14, wherein said thin film transistor is formed in a peripheral circuit portion except for a portion on which a memory cell unit is arranged.

\* \* \* \* \*